(12) United States Patent
Kwon et al.

(10) Patent No.: US 8,450,169 B2
(45) Date of Patent: May 28, 2013

(54) REPLACEMENT METAL GATE STRUCTURES PROVIDING INDEPENDENT CONTROL ON WORK FUNCTION AND GATE LEAKAGE CURRENT

(75) Inventors: Unoh Kwon, Fishkill, NY (US); Ramachandra Divakaruni, Ossining, NY (US); Siddarth A. Krishnan, Peekskill, NY (US); Ravikumar Ramachandran, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 12/954,946

(22) Filed: Nov. 29, 2010

(65) Prior Publication Data
US 2012/0132998 A1 May 31, 2012

(51) Int. Cl.
*H01L 21/8238* (2006.01)

(52) U.S. Cl.
USPC .... 438/216; 438/211; 438/230; 257/E21.204; 257/E21.206; 257/E21.632

(58) Field of Classification Search
USPC .......... 257/369, E21.204, E21.206, E21.632; 438/211, 217, 230, 369
See application file for complete search history.

(56) References Cited

U.S. PATENT DOCUMENTS

| | | | |
|---|---|---|---|
| 6,872,627 B2 | 3/2005 | Chen et al. | |
| 2005/0287746 A1 | 12/2005 | Metz et al. | |
| 2006/0121678 A1* | 6/2006 | Brask et al. | 438/287 |
| 2009/0230479 A1* | 9/2009 | Hsu et al. | 257/369 |
| 2010/0052066 A1* | 3/2010 | Yu et al. | 257/369 |

* cited by examiner

*Primary Examiner* — Robert Huber
(74) *Attorney, Agent, or Firm* — Scully, Scott, Murphy & Presser, P.C.; H. Daniel Schnurmann

(57) ABSTRACT

The thickness and composition of a gate dielectric can be selected for different types of field effect transistors through a planar high dielectric constant material portion, which can be provided only for selected types of field effect transistors. Further, the work function of field effect transistors can be tuned independent of selection of the material stack for the gate dielectric. A stack of a barrier metal layer and a first-type work function metal layer is deposited on a gate dielectric layer within recessed gate cavities after removal of disposable gate material portions. After patterning the first-type work function metal layer, a second-type work function metal layer is deposited directly on the barrier metal layer in the regions of the second type field effect transistor. A conductive material fills the gate cavities, and a subsequent planarization process forms dual work function metal gate structures.

19 Claims, 18 Drawing Sheets

REPLACEMENT METAL GATE STRUCTURES PROVIDING INDEPENDENT CONTROL ON WORK FUNCTION AND GATE LEAKAGE CURRENT

BACKGROUND

The present disclosure generally relates to semiconductor devices, and particularly to complementary metal-oxide-semiconductor (CMOS) field effect transistors having dual work function metal gates and high-k gate dielectrics having different composition and thickness, and methods of manufacturing the same.

High gate leakage current of silicon oxide and nitrided silicon dioxide as well as depletion effect of polysilicon gate electrodes limits the performance of conventional semiconductor oxide based gate electrodes. High performance devices for an equivalent oxide thickness (EOT) less than 1 nm require high dielectric constant (high-k) gate dielectrics and metal gate electrodes to limit the gate leakage current and provide high on-currents. Materials for high-k gate dielectrics include $ZrO_2$, $HfO_2$, other dielectric metal oxides, alloys thereof, and their silicate alloys.

In general, dual metal gate CMOS integration schemes employ two gate materials, one having a work function near the valence band edge of the semiconductor material in the channel and the other having a work function near the conduction band edge of the same semiconductor material. In CMOS devices having a silicon channel, a conductive material having a work function of 4.0 eV is necessary for n-type metal oxide semiconductor field effect transistors (NMOSFETs, or "NFETs") and another conductive material having a work function of 5.0 eV is necessary for p-type metal oxide semiconductor field effect transistors (PMOSFETs, or "PFETs"). In conventional CMOS devices employing polysilicon gate materials, a heavily p-doped polysilicon gate and a heavily n-doped polysilicon gate are employed to address the needs. In CMOS devices employing high-k gate dielectric materials, two types of gate stacks comprising suitable materials satisfying the work function requirements are needed for the PFETs and for the NFETS, in which the gate stack for the PFETs provides a flat band voltage closer to the valence band edge of the material of the channel of the PFETs, and the gate stack for the NFETs provides a flat band voltage closer to the conduction band edge of the material of the channel of the NFETs. In other words, threshold voltages need to be optimized differently between the PFETs and the NFETs.

Manufacture of dual metal gate CMOS structures is difficult because two types of metal gate electrodes are needed to provide different work functions. Integration of dual gate CMOS structures with a replacement gate structure is even more difficult because of the difficulty in patterning different metal layers in replacement gate geometries. This difficulty is further complicated because p-type field effect transistors and n-type field effect transistors may have different requirements for gate leakage current.

BRIEF SUMMARY

The thickness and composition of a gate dielectric can be selected for different types of field effect transistors. A first field effect transistor includes a first gate dielectric having a first U-shaped gate dielectric portion, and a second field effect transistor includes a second gate dielectric having a stack of a planar high dielectric constant material portion and a second U-shaped gate dielectric portion. The planar high dielectric constant material portion can be provided by depositing and patterning a high dielectric constant material layer prior to formation of temporary gate structures. Transistors having different leakage current through a gate dielectric can be formed by selecting whether a planar high dielectric constant portion is present or not.

Further, the work function of field effect transistors can be tuned independent of selection of the material stack for the gate dielectric. A stack of a barrier metal layer and a first-type work function metal layer having a first-type work function is deposited on a gate dielectric layer within recessed gate cavities after removal of disposable gate material portions. The first-type work function metal layer is patterned to be present in regions of a first type field effect transistor, which can be p-type or n-type transistors, while removed in regions of a second type field effect transistor. A second-type work function metal layer is deposited directly on the barrier metal layer in the regions of the second type field effect transistor. A conductive material fills the gate cavities, and a subsequent planarization process forms dual work function metal gate structures.

According to an aspect of the present disclosure, a method of forming a semiconductor structure including a first field effect transistor and a second field effect transistor is provided. The method includes: forming a high dielectric constant material layer on a semiconductor substrate; forming temporary gate structures and a planarization dielectric layer having a planar dielectric surface on the semiconductor substrate, wherein the temporary gate structures include disposable gate material portions; recessing the disposable gate material portions below the planar dielectric surface to form gate cavities over the semiconductor substrate, wherein a material of the planar dielectric material portion is present within one of the gate cavities and is not present in another of the gate cavities; forming a contiguous gate dielectric layer in the gate cavities and on the planar dielectric surface; and forming first and second gate dielectrics by removing portions of the contiguous gate dielectric layer above the planar dielectric surface, wherein a horizontal portion of the second gate dielectric has a different thickness than a horizontal portion of the first gate dielectric.

According to another aspect of the present disclosure, a semiconductor structure includes a first field effect transistor and a second field effect transistor that are located on a semiconductor substrate including a semiconductor material. The first field effect transistor includes: a first gate dielectric located over a first portion of the semiconductor substrate; a first-type work function metal portion including a first metal having a first work function and overlying a horizontal portion of the first gate dielectric; and a first second-type work function metal portion including a second metal having a second work function and contacting the first-type work function metal portion. The second field effect transistor includes: a second gate dielectric located over a second portion of the semiconductor substrate; and a second second-type work function metal portion including the second metal and overlying a horizontal portion of the second gate dielectric, wherein the horizontal portion of the second gate dielectric has a different thickness than the horizontal portion of the first gate dielectric.

DETAILED DESCRIPTION

Figure 1:
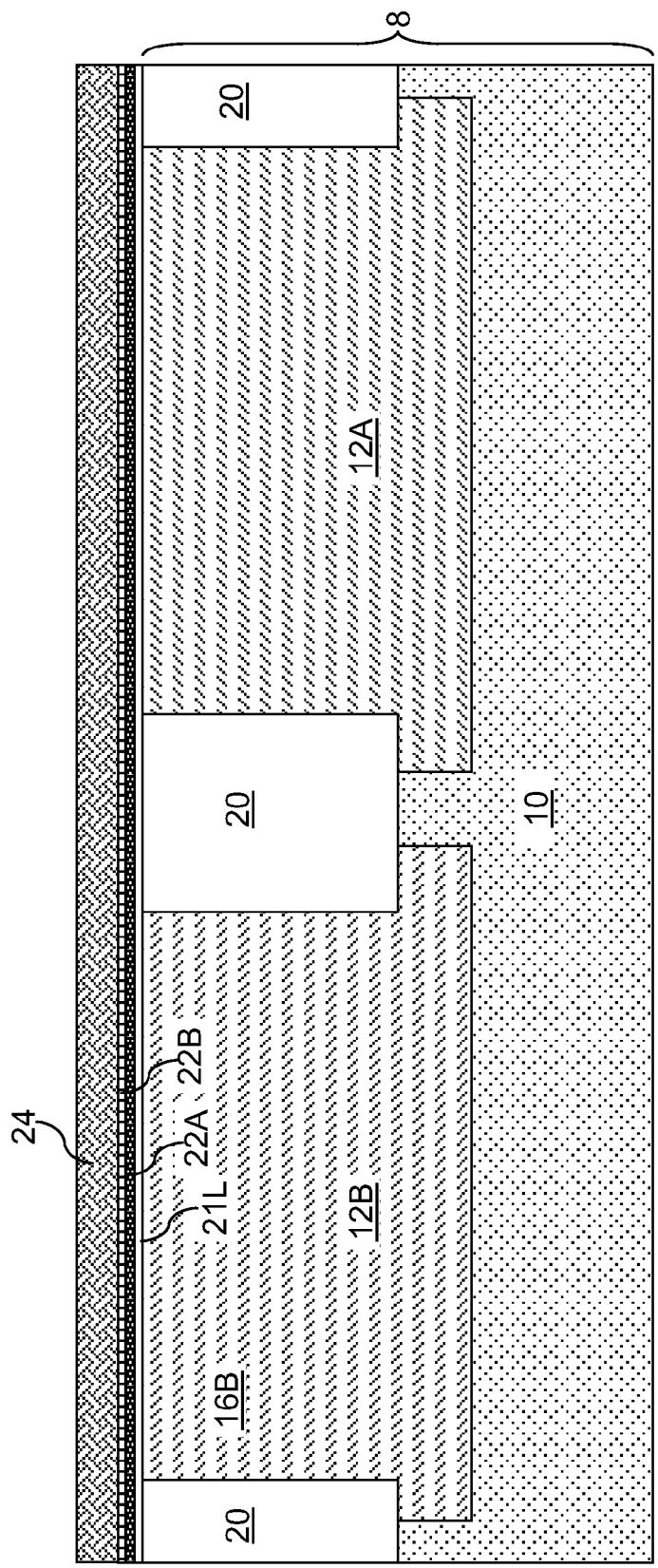
FIG. 1 is a vertical cross-sectional view of a first exemplary semiconductor structure after formation of a stack of an optional interfacial dielectric material layer, a high dielectric constant material layer, an adjustment material layer, and an optional metallic material layer according to a first embodiment of the present disclosure.

As stated above, the present disclosure relates to semiconductor structures having dual work function metal gates and a high-k gate dielectric, and methods of manufacturing the same, which are now described in detail with accompanying figures. It is noted that like and corresponding elements mentioned herein and illustrated in the drawings are referred to by like reference numerals. It is also noted that proportions of various elements in the accompanying figures are not drawn to scale to enable clear illustration of elements having smaller dimensions relative to other elements having larger dimensions. Further, it is noted that ordinal references of elements in the present disclosure are employed for the only purpose of labeling similar elements. As such, a "second" element when considered without reference to a corresponding first element may be referred to as a "first" element in the claims, despite references to the same element as a "second" element in the specification, as would be obvious to one of ordinary skill in the art.

Referring to FIG. 1, a first exemplary semiconductor structure according to a first embodiment of the present disclosure includes a semiconductor substrate 8, on which various components of field effect transistors can be formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer. The semiconductor material of the semiconductor substrate 8 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material includes silicon.

Various portions of the semiconductor material in the semiconductor substrate 8 can be doped with electrical dopants of p-type or n-type at different dopant concentration levels. For example, the semiconductor substrate 8 may include an underlying semiconductor layer 10, a first conductivity type well 12B, and a second-conductivity type well 12A. The first conductivity type well 12B is doped with electrical dopants of a first conductivity type, which can be p-type or n-type. The second conductivity type well 12A is doped with electrical dopants of a second conductivity type, which is the opposite type of the first conductivity type. For example, if the first conductivity type is p-type, the second conductivity type is n-type, and vice versa. In one embodiment, the first conductivity type is p-type and the second conductivity type is n-type. In another embodiment, the first conductivity type is n-type and the second conductivity type is p-type.

The dopant concentration of the first conductivity type well 12B and the second conductivity type well 12A can be from $1.0 \times 10^{14}/cm^3$ to $1.0 \times 10^{19}/cm^3$, and typically from $1.0 \times 10^{16}/cm^3$ to $1.0 \times 10^{19}/cm^3$, although lesser and greater concentrations can also be employed. The dopant concentration of the underlying semiconductor layer 10 can be from $1.0\times10^{14}/cm^3$ to $1.0\times10^{19}/cm^3$, and typically from $1.0\times10^{15}/cm^3$ to $1.0\times10^{16}/cm^3$, although lesser and greater concentrations can also be employed.

Shallow trench isolation structures 20 can be formed to laterally separate each of the first conductivity type well 12B and the second conductivity type well 12A. Typically, each of the first conductivity type well 12B and the second conductivity type well 12A is laterally surrounded by a contiguous portion of the shallow trench isolation structures 20. If the semiconductor substrate 8 is a semiconductor-on-insulator substrate, bottom surfaces of the first conductivity type well 12B and the second conductivity type well 12A may contact a buried insulator layer (not shown), which electrically isolates each of the first conductivity type well 12B and the second conductivity type well 12A from other semiconductor portions of the semiconductor substrate 8 in conjunction with the shallow trench isolation structures 20.

In some embodiments, at least one of the first conductivity type well 12B and the second conductivity type well 12A may include a single crystalline semiconductor material layer (not separately shown) in an upper portion thereof. The single crystalline semiconductor material layer can include a semiconductor material that is different from the semiconductor material of the underlying portion of the first conductivity type well 12B and the second conductivity type well 12A, and is epitaxially aligned to an underlying portion of the first conductivity type well 12B and the second conductivity type well 12A. For example, the single crystalline semiconductor material layer can be a silicon-germanium alloy layer, a silicon-carbon alloy layer, or a silicon-germanium-carbon alloy layer.

An optional interfacial dielectric material layer 21L, a high dielectric constant material layer 22A, an adjustment material layer 22B, and an optional metallic material layer 24 are sequentially deposited on the top surface of the semiconductor substrate 8. In one embodiment, the optional interfacial dielectric material layer 21L is present as an interfacial dielectric material layer. In another embodiment, the optional interfacial dielectric material layer 21L is not present. In case the optional interfacial dielectric material layer 21L is present, the optional interfacial dielectric material layer 21L can include a dielectric oxide, a dielectric nitride, or a dielectric oxynitride of the semiconductor material of the first conductivity type well 12B and the second conductivity type well 12A. In a non-limiting illustrative example, if the first conductivity type well 12B and the second conductivity type well 12A include silicon, the optional interfacial dielectric material layer 21L can include silicon oxide. The optional interfacial dielectric material layer 21L can be formed as a contiguous blanket layer (without any pattern therein), for example, by chemical vapor deposition, or it can be formed selectively on semiconductor surfaces by conversion of a semiconductor material, for example, by thermal oxidation, thermal nitridation, chemical oxidation, chemical nitridation, plasma oxidation, plasma nitridation, or a combination thereof. The thickness of the optional interfacial dielectric material layer 21L can be from 0 nm to 1 nm, although greater thicknesses can also be employed. The dielectric constant of the optional interfacial dielectric material layer 21L is typically less than 8.0.

The high dielectric constant material layer 22A includes a material having a "high dielectric constant material." A "high dielectric constant material," or a "high-k dielectric material," herein refers to a dielectric material having a dielectric constant greater than 8.0. The high dielectric constant material layer 22A can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high dielectric constant material layer 22A, as measured at horizontal portions, can be from 0.3 nm to 3 nm, and preferably from 0.6 nm to 2 nm.

The adjustment material layer 22B includes a material that can subsequently diffuse into the material of the high dielectric constant material layer 22A upon an anneal to affect the leakage current level and/or the dielectric constant of the high dielectric constant material in the high dielectric constant material layer 22A. Thus, the material of the adjustment material layer 22B "adjusts," or alters the characteristics of the high dielectric constant material layer 22A upon a subsequent diffusion, which occurs during a drive-in anneal.

In one embodiment, the adjustment material layer 22B can include another high dielectric constant material having a different composition than the material of the high dielectric constant material layer 22A. The high dielectric constant material of the adjustment material layer 22B can be any of the materials that can be employed for the high dielectric constant material layer 22A, provided that the material selected for the adjustment material layer 22B is different from the material selected for the high dielectric constant material layer 22A. For example, the high dielectric constant material layer 22A can include $HfO_2$, $ZrO_2$, $HfO_xN_y$, $ZrO_xN_y$, a silicate thereof, or an alloy thereof, and the adjustment material layer 22B can include $La_2O_3$, $La_2O_xN_y$, a silicate thereof, or an alloy thereof. Each value of x is independently from 0.5 to 3 and each value of y is independently from 0 to 2.

In another embodiment, the adjustment material layer 22B can include any metal oxide, which can be a dielectric material having a dielectric constant greater than, equal to, or less than 8.0 or can be a conductive material, i.e., a conductive metal oxide. For example, the adjustment material layer can include MgO.

In yet another embodiment, the adjustment material layer 22B can include any conductive material such as a transition metal, an alkaline earth metal, a Lanthanide metal, an Actinide metal, or a combination thereof. For example, the adjustment material layer 22B can include La.

The thickness of the adjustment material layer 22B can be from 0.1 nm to 2 nm, and typically from 0.3 nm to 1 nm, although lesser and greater thicknesses can also be employed. The adjustment material layer 22B can be deposited by chemical vapor deposition (CVD), physical vapor deposition (PVD), molecular beam deposition (MBD), pulsed laser deposition (PLD), liquid source misted chemical deposition (LSMCD), atomic layer deposition (ALD), etc.

The optional metallic material layer 24 may, or may not, be present. If present, the optional metallic material layer 24 includes a material that encapsulates the adjustment material layer 22B during a subsequent anneal to prevent loss of material from the adjustment material layer 22B and to ensure that the material of the adjustment material layer 22B is driven into the material of the high dielectric constant material layer 22A. The optional metallic material layer 24 can include a conductive metal nitride such as TiN, TaN, WN, or a combination thereof. The optional metallic material layer 24 can be deposited by chemical vapor deposition (CVD) or physical vapor deposition (PVD). The thickness of the optional metallic material layer 24 can be from 1 nm to 100 nm, and typically from 2 nm to 10 nm, although lesser and greater thicknesses can also be employed.

Figure 2:
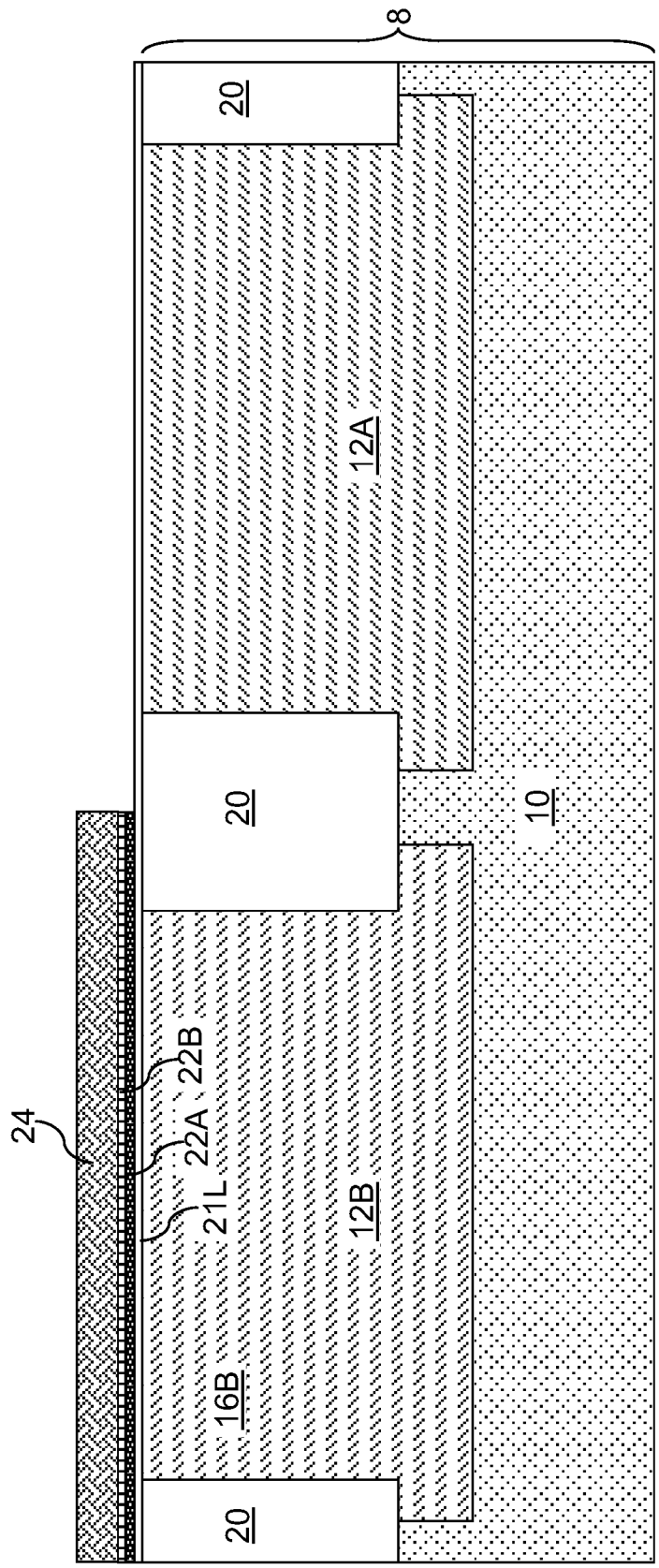
FIG. 2 is a vertical cross-sectional view of the first exemplary semiconductor structure of FIG. 1 after patterning of the stack of the optional interfacial dielectric material layer, the high dielectric constant material layer, the adjustment material layer, and the metallic material layer.

Referring to FIG. 2, the stack of the high dielectric constant material layer 22A, the adjustment material layer 22B, and the optional metallic material layer 24 is patterned so that the remaining portion of this stack is present, after patterning, over the first conductivity type well 12B, but is not present over the second conductivity type well 12A. The patterning of the stack can be performed, for example, by applying and lithographically patterning a photoresist (not shown) and transferring the pattern in the photoresist into the stack. The photoresist is subsequently removed. The transfer of the pattern can be performed employing an anisotropic etch that is selective to the material of the optional interfacial dielectric material layer 21L, i.e., the anisotropic etch can stop at the optional interfacial dielectric material layer 21L, if present. Otherwise, the anisotropic etch can stop on the top surface of the second conductivity type well 12A.

Figure 3:
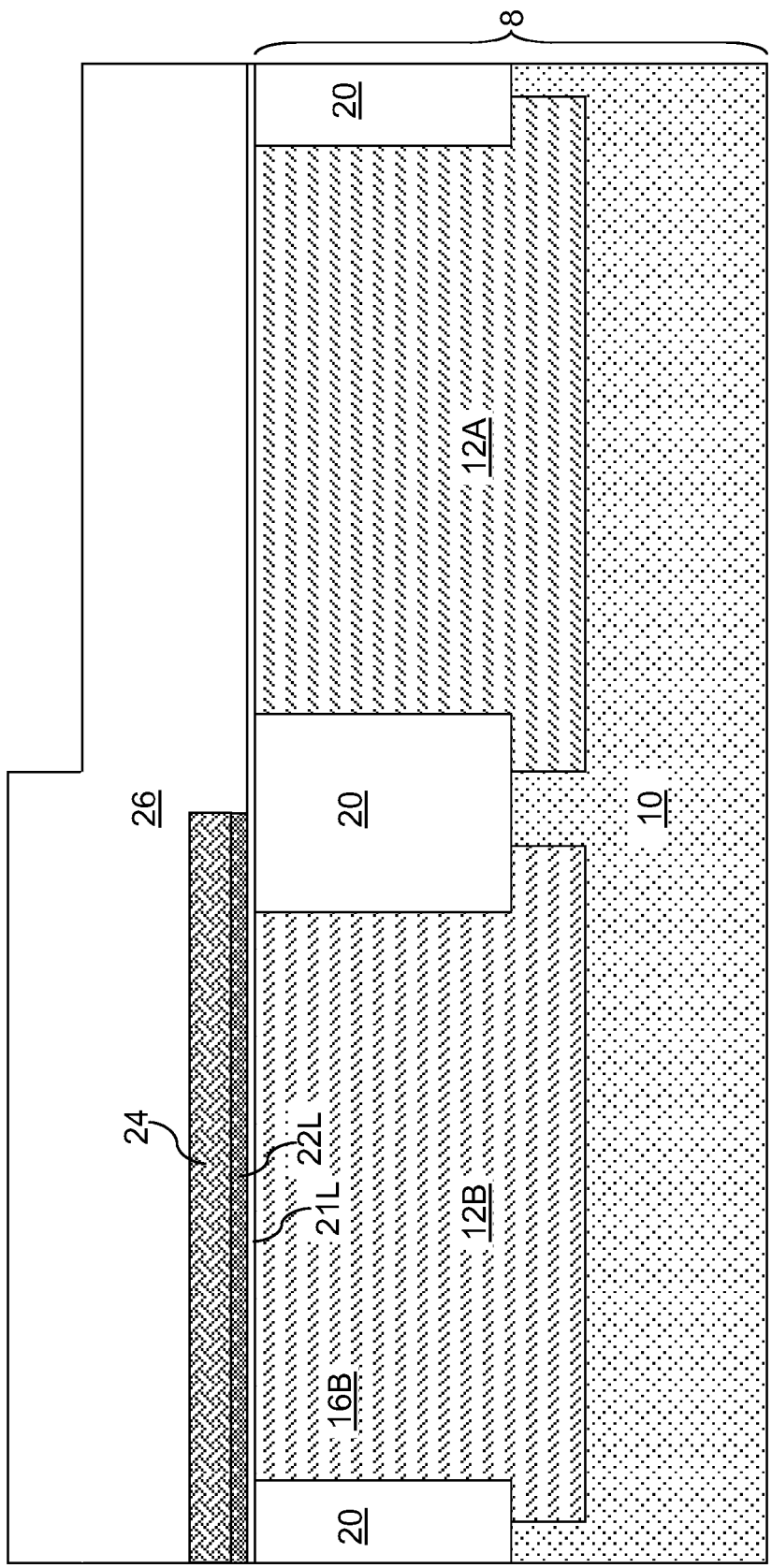
FIG. 3 is a vertical cross-sectional view of the first exemplary semiconductor structure of FIG. 2 after forming a capping material layer and a drive-in anneal.

Referring to FIG. 3, a capping material layer 26 is deposited over the patterned stack of the high dielectric constant material layer 22A, the adjustment material layer 22B, and the optional metallic material layer 24 and over the first conductivity type well 12B. The capping material layer 26 includes a material that can prevent the lateral loss of the material of the adjustment material layer 22B. The capping material layer 26 can be silicon nitride, silicon oxynitride, silicon, or a combination thereof. In one embodiment, the capping material layer 26 is a material that can be removed selective to the material on the surface of the second conductivity type well 12A. The capping material layer 26 can be deposited by chemical vapor deposition (CVD) or physical vapor deposition (PVD). The thickness of the capping material layer 26 can be from 5 nm to 300 nm, and typically from 10 nm to 150 nm, although lesser and greater thicknesses can also be employed.

A drive-in anneal is performed to induce diffusion of the material of the adjustment material layer 22B into the high dielectric constant material layer 22A. The temperature of the drive-in anneal can be from 500° C. to 1100° C., and typically from 650° C. to 1000° C. The duration of the drive-in anneal can be from 1 second to 10 minutes, and typically from 5 seconds to 5 minutes, although lesser and greater time duration can also be employed.

The drive-in anneal converts the stack of the adjustment material layer 22B and the high dielectric constant material layer 22A into a modified high dielectric constant material layer 22L. In one embodiment, the modified high dielectric constant material layer 22L is a single homogeneous dielectric material layer having a dielectric constant greater than 8.0. The materials of the adjustment material layer 22B and the high dielectric constant material layer 22A are homogeneously mixed in the modified high dielectric constant material layer 22L in this embodiment. In another embodiment, the interdiffusion of the material of the adjustment material layer 22B into the high dielectric constant material layer 22A can be incomplete, and the modified high dielectric constant material layer 22L can be a vertically graded layer in which the composition of the modified high dielectric constant material layer 22L changes in a vertical direction such that the concentration of the component of the adjustment material layer 22B increases with distance from the semiconductor substrate 8. The thickness of the modified high dielectric constant material layer 22L can be from 0.6 nm to 5 nm, and typically from 1.0 nm to 2.5 nm, although lesser and greater thicknesses can also be employed.

Figure 4:
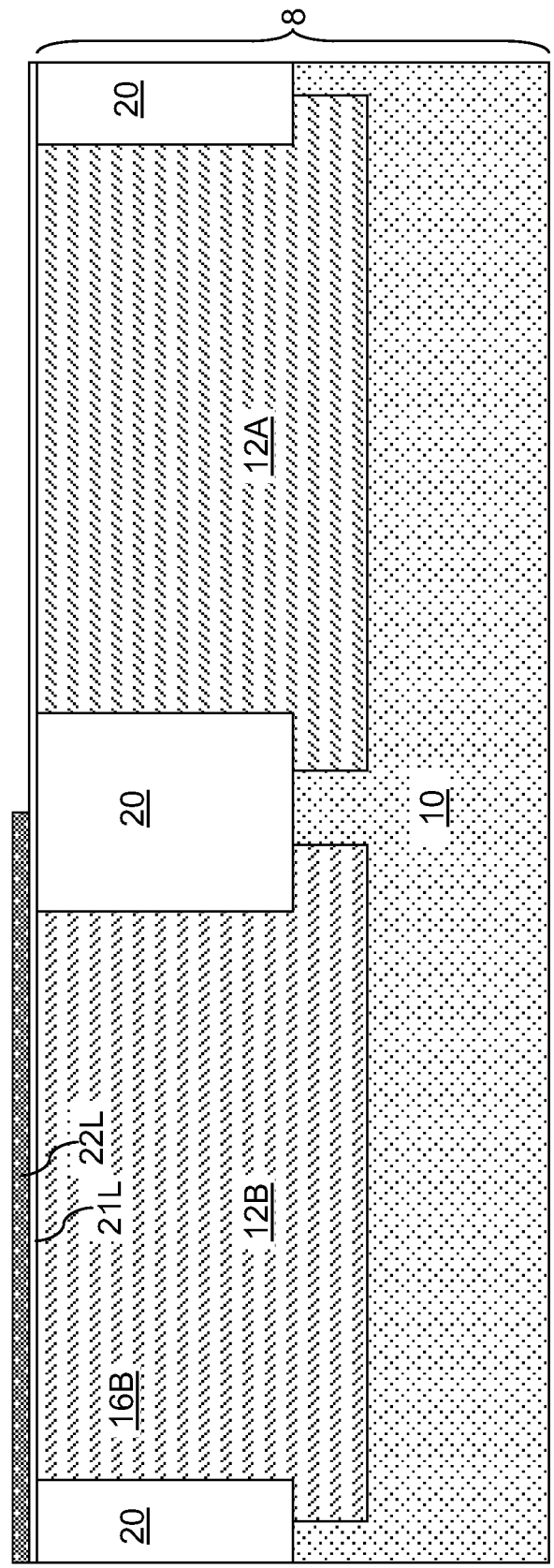
FIG. 4 is a vertical cross-sectional view of the first exemplary semiconductor structure of FIG. 3 after removal of the capping material layer and the metallic material layer.

Referring to FIG. 4, the capping material layer 26 and the optional metallic material layer 24 are removed selective to the modified high dielectric constant material layer 22L and one of optional interfacial dielectric material layer 21L and the semiconductor material on the exposed surface of the second conductivity type well 12A employing selective etch chemistries known in the art. If the optional interfacial dielectric material layer 21L is not present, removal of the capping material layer 26 and/or the optional metallic material layer 24 can be performed selective to the material of the second conductivity type well 12A by selecting a material different from the material of the second conductivity type well 12A for the material for the capping material layer 26.

Figure 5:
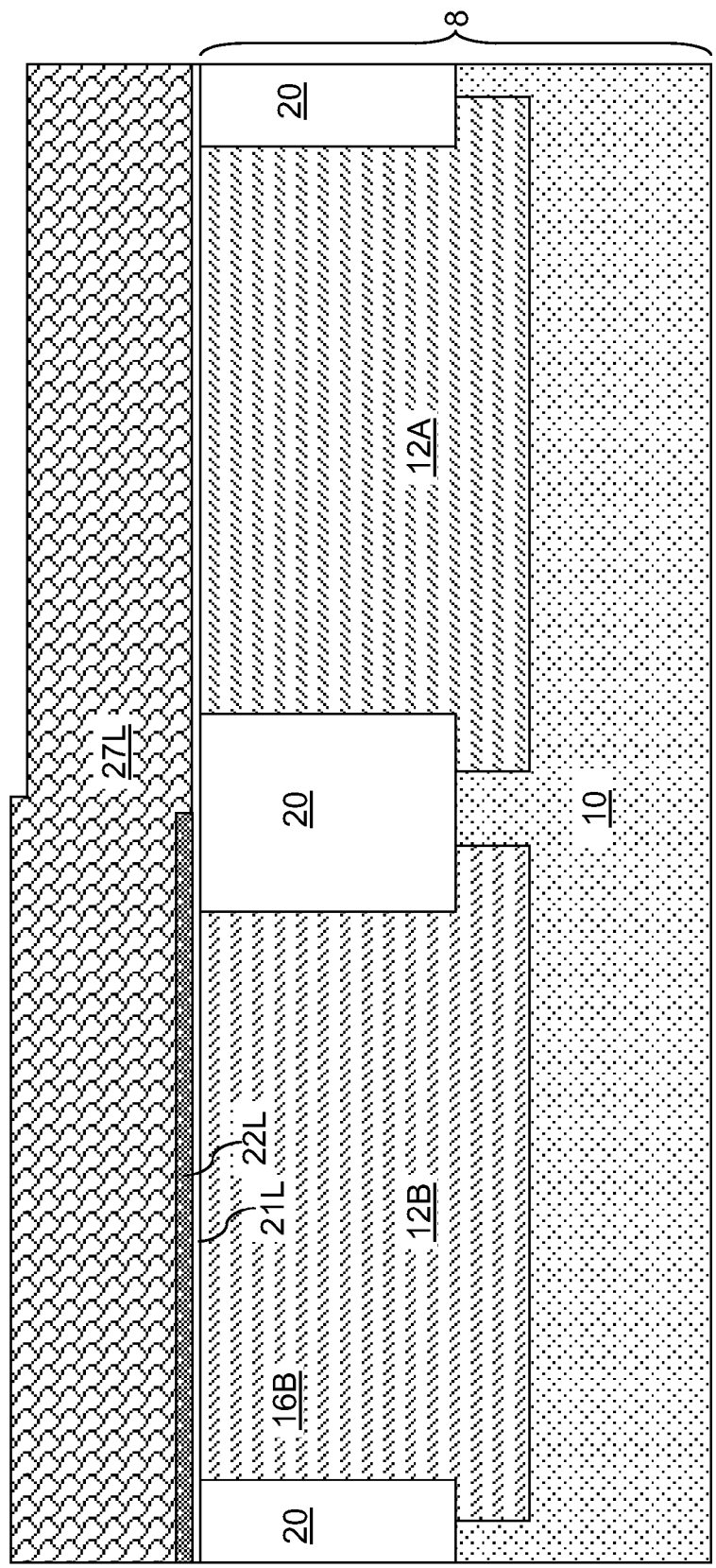
FIG. 5 is a vertical cross-sectional view of the first exemplary semiconductor structure of FIG. 4 after formation of a disposable gate material layer.

Referring to FIG. 5, a disposable gate material layer 27L is deposited on the modified high dielectric constant material layer 22L and one of the optional interfacial dielectric material layer 21L, if present, and the top surface of the second conductivity type well 12A. The disposable gate material layer 27L includes a material that can be subsequently removed selective to dielectric materials. The disposable gate material layer 27L can include a semiconductor material. For example, the semiconductor material of the disposable gate material layer 27L can be silicon, germanium, a silicon-germanium alloy, or any other material that can be removed selective to the material of the modified high dielectric constant material layer 22L. The disposable gate material layer 27L can be polycrystalline or amorphous, and can be deposited by chemical vapor deposition (CVD) or physical vapor deposition (PVD). The thickness of the disposable gate material layer 27L can be from 20 nm to 300 nm, and typically from 30 nm to 150 nm, although lesser and greater thicknesses can also be employed.

Figure 6:
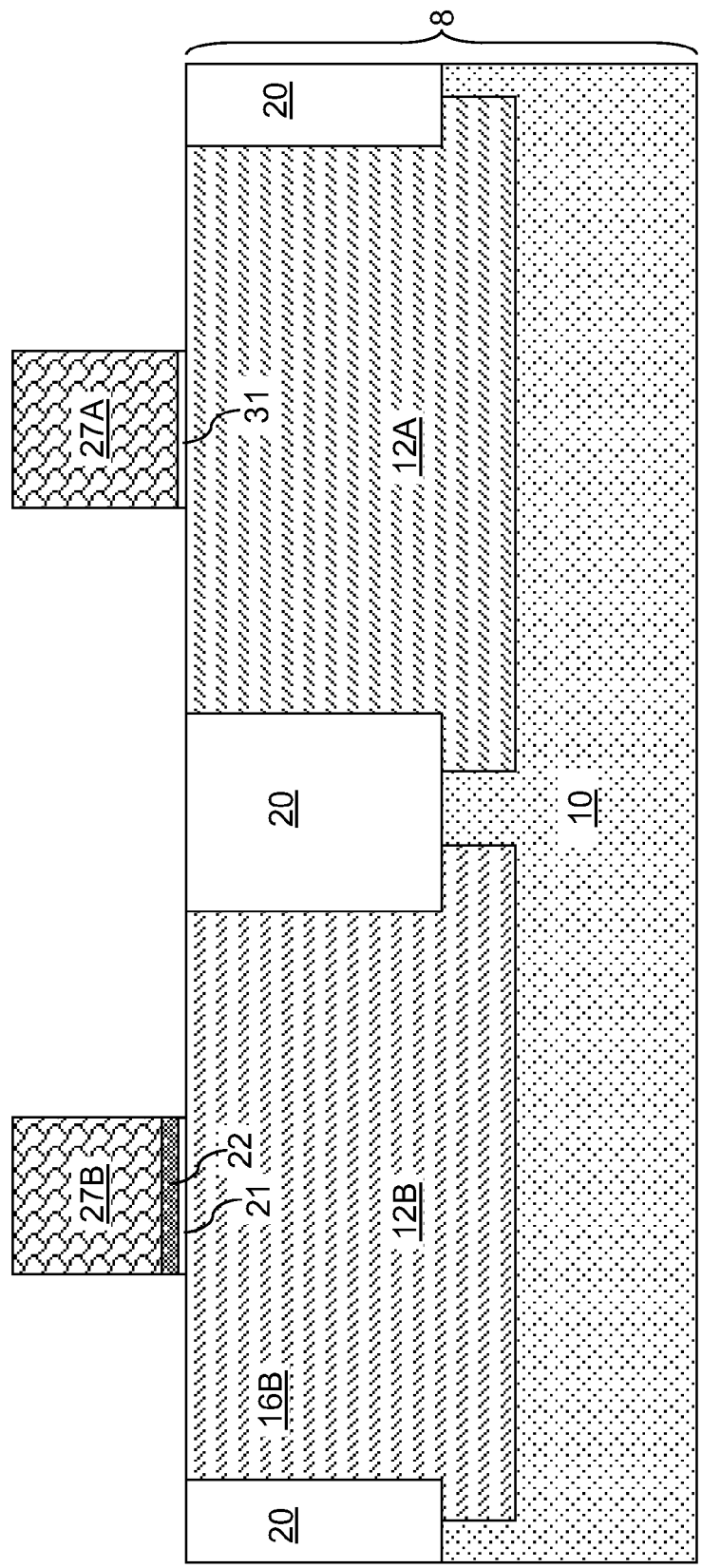
FIG. 6 is a vertical cross-sectional view of the first exemplary semiconductor structure of FIG. 5 after formation of temporary gate structures.

Referring to FIG. 6, the disposable gate material layer 27L, the modified high dielectric constant material layer 22L, and the optional interfacial dielectric material layer 21L are lithographically patterned to form temporary gate structures. For example, the temporary gate structure may include a first temporary gate structure that is a stack of a first optional interfacial dielectric material portion 31 and a first disposable gate material portion 27A and a second temporary gate structure that is a stack of a second optional interfacial dielectric material portion 21, a planar high dielectric constant material portion 22, and a second disposable gate material portion 27B.

The first optional interfacial dielectric material portion 31 is a remaining portion of the optional interfacial dielectric material layer 21L located on a portion of the second conductivity type well 12A. The first disposable gate material portion 27A is a remaining portion of the disposable gate material layer 27L formed over the first optional interfacial dielectric material portion 31, and in case the first optional interfacial dielectric material portion 31 is not present, directly on a portion of the top surface of the second conductivity type well 12A. The second optional interfacial dielectric material portion 21 is a remaining portion of the optional interfacial dielectric material layer 21L located on a portion of the first conductivity type well 12A. The planar high dielectric constant material portion 22 is a remaining portion of the modified high dielectric constant material layer 22L located on the second optional interfacial dielectric material portion 21 or, if the second optional interfacial dielectric material portion 21 is not present, located directly on a portion of the first conductivity type well 12B. The second disposable gate material portion 27B is a remaining portion of the disposable gate material layer 27L formed over the planar high dielectric constant material portion 22.

Figure 7:
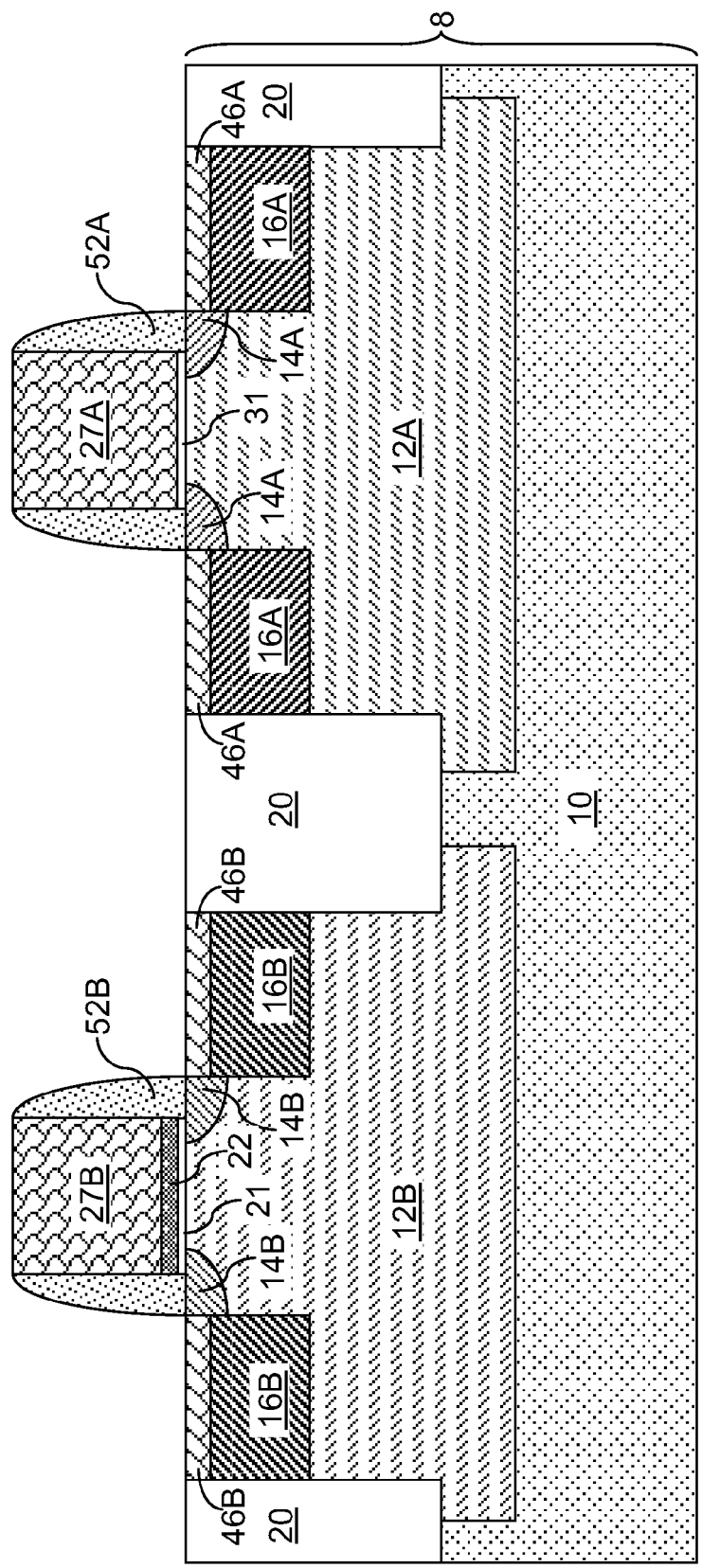
FIG. 7 is a vertical cross-sectional view of the first exemplary semiconductor structure of FIG. 6 after formation of source and drain extension regions, dielectric gate spacers, source and drain regions, and metal semiconductor alloy regions.

Referring to FIG. 7, dopants of the first conductivity type are implanted into portions of the second conductivity type well 12A that are not covered by the first temporary gate structure (31, 27A) to form first source and drain extension regions 14A. The first conductivity type well 12B can be masked by a photoresist (not shown) during the implantation of the first conductivity type dopants to prevent implantation of the first conductivity type dopants therein. The dopant concentration in the first source and drain extension regions 14A can be from $1.0 \times 10^{18}/cm^3$ to $1.0 \times 10^{21}/cm^3$, and typically from $1.0 \times 10^{19}/cm^3$ to $3.0 \times 10^{20}/cm^3$, although lesser and greater concentrations can also be employed.

Similarly, dopants of the second conductivity type are implanted into portions of the first conductivity type well 12B that are not covered by the second temporary gate structure (21, 22, 27B) to form second source and drain extension regions 14B. The second conductivity type well 12A can be masked by a photoresist (not shown) during the implantation of the second conductivity type dopants to prevent implantation of the second conductivity type dopants therein. The dopant concentration in the second source and drain extension regions 14B can be from $1.0 \times 10^{18}/cm^3$ to $1.0 \times 10^{21}/cm^3$, and typically from $1.0 \times 10^{19}/cm^3$ to $3.0 \times 10^{20}/cm^3$, although lesser and greater concentrations can also be employed.

Dielectric gate spacers are formed on sidewalls of each of the temporary gate structures, for example, by deposition of a conformal dielectric material layer and an anisotropic etch. The dielectric gate spacers include a first dielectric gate spacer 52A formed around the first temporary gate structure (31, 27A) and a second dielectric gate spacer 52B formed around the second temporary gate structure (21, 22, 27B).

Dopants of the first conductivity type are implanted into portions of the second conductivity type well 12A that are not covered by the first temporary gate structure (31, 27A) and the first dielectric gate spacer 52A to form first source and drain regions 16A. The first conductivity type well 12B can be masked by a photoresist (not shown) during the implantation of the first conductivity type dopants to prevent implantation of the first conductivity type dopants therein. The dopant concentration in the first source and drain regions 16A can be from $1.0 \times 10^{19}/cm^3$ to $1.0 \times 10^{21}/cm^3$, and typically from $1.0 \times 10^{20}/cm^3$ to $5.0 \times 10^{20}/cm^3$, although lesser and greater concentrations can also be employed.

Similarly, dopants of the second conductivity type are implanted into portions of the first conductivity type well 12B that are not covered by the second temporary gate structure (21, 22, 27B) and the second dielectric gate spacer 52B to form second source and drain regions 16B. The second conductivity type well 12A can be masked by a photoresist (not shown) during the implantation of the second conductivity type dopants to prevent implantation of the second conductivity type dopants therein. The dopant concentration in the second source and drain regions 16B can be from $1.0 \times 10^{19}/cm^3$ to $1.0 \times 10^{21}/cm^3$, and typically from $1.0 \times 10^{20}/cm^3$ to $5.0 \times 10^{20}/cm^3$, although lesser and greater concentrations can also be employed.

In some embodiments, the first source and drain regions 16A and/or the second source and drain regions 16B can be formed by replacement of the semiconductor material in the second conductivity type well 12A and/or the semiconductor material in the first conductivity type well 12B with a new semiconductor material having a different lattice constant. In this case, the new semiconductor material(s) is/are typically epitaxially aligned with (a) single crystalline semiconductor material(s) of the second conductivity type well 12A and/or the semiconductor material in the first conductivity type well 12B, and apply/applies a compressive stress or a tensile stress to the semiconductor material of the second conductivity type well 12A and/or the semiconductor material in the first conductivity type well 12B between the first source and drain extension regions 14A and/or between the second source and drain extension regions 14B.

First metal semiconductor alloy regions 46A and second metal semiconductor alloy regions 46B are formed on exposed semiconductor material on the top surface of the semiconductor substrate 8, for example, by deposition of a metal layer (not shown) and an anneal. Unreacted portions of the metal layer are removed selective to reacted portions of the metal layer. The reacted portions of the metal layer constitute the metal semiconductor alloy regions (46A, 46B), which can include a metal silicide portions if the semiconductor material of the first and second source and drain regions (16A, 16B) include silicon.

Figure 8:
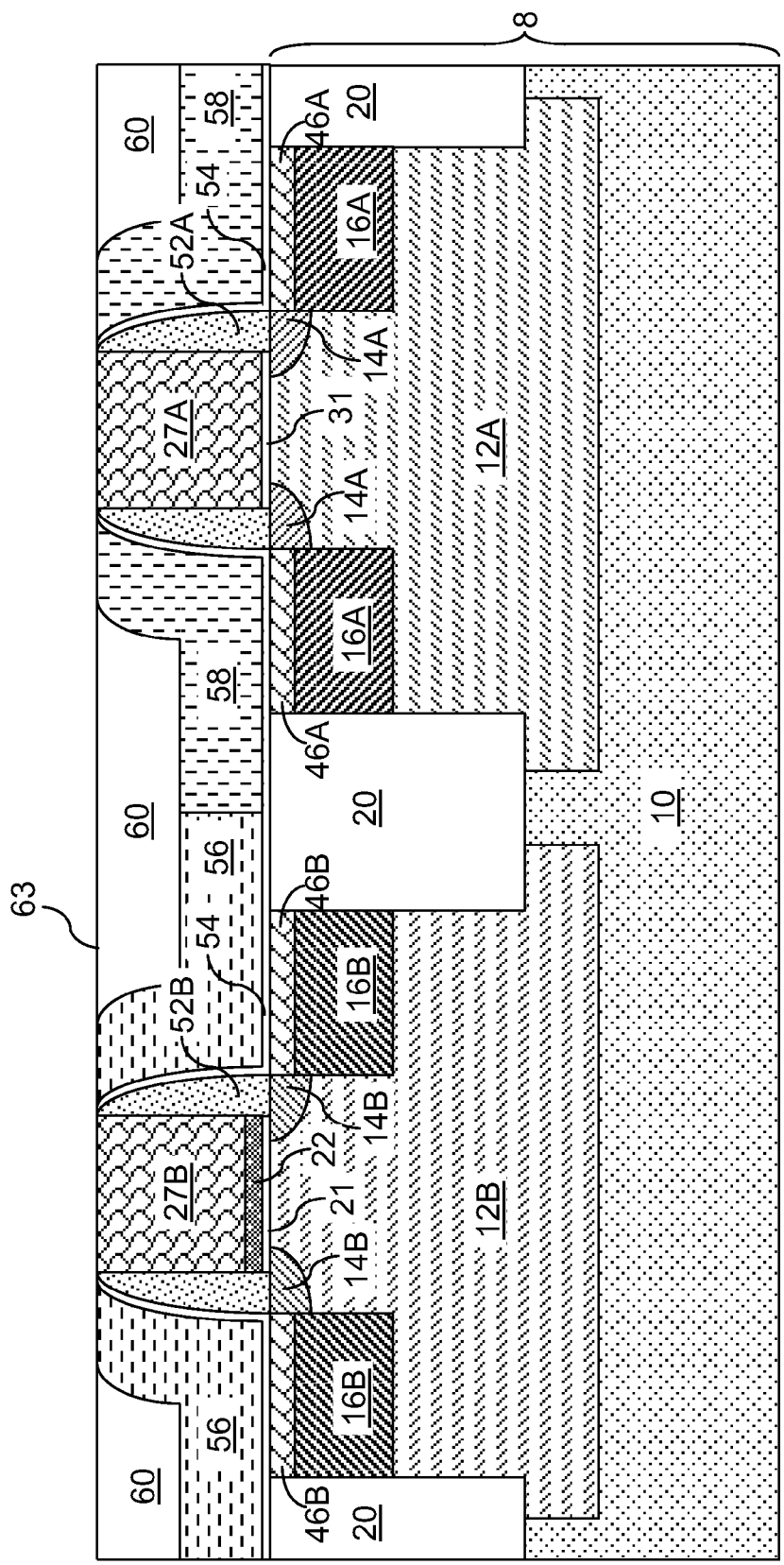
FIG. 8 is a vertical cross-sectional view of the first exemplary semiconductor structure of FIG. 7 after formation of temporary gate structures and formation of a planar dielectric surface on a planarization dielectric layer according to a first embodiment of the present disclosure.

Referring to FIG. 8, a dielectric liner 54 may optionally be deposited over the metal semiconductor alloy regions 54, the first and second temporary gate structures (31, 27A, 21, 22, 27B), and the first and second dielectric gate spacers (52A, 52B). A first type stress-generating liner 58 and a second type stress-generating liner 56 may optionally be formed over the first temporary gate structure (31, 27A) and the second temporary gate structure (21, 22, 27B), respectively. The first type stress-generating liner 58 and/or the second type stress-generating liner 56 can be employed to apply uniaxial or biaxial lateral stress to a first channel region, which is the portion of the second conductivity type well 12A between the first source and drain extension regions 14A, and/or to a second channel region, which is the portion of the first conductivity type well 12B between the second source and drain extension regions 14B, respectively. In one embodiment, one of the first type stress-generating liner 58 and the second type stress-generating liner 56 applies a compressive stress if underlying source and drain regions (i.e., the first source and drain regions 16A or the second source and drain regions 16B) are p-doped regions, and the other of the first type stress-generating liner 58 or the second type stress-generating liner 56 applies a tensile stress if underlying source and drain regions (i.e., the second source and drain regions 16B and the first source and drain regions 16A) are n-doped regions. The first type stress-generating liner 58 and the second type stress-generating liner 56 can include a dielectric material that generates a compressive stress or a tensile stress to underlying structures, and can be silicon nitride layers deposited by plasma enhanced chemical vapor deposition under various plasma conditions.

A planarization dielectric layer 60 is deposited over the first type stress-generating liner 58 and/or the second type stress-generating liner 56, if present, or over the metal semiconductor alloy regions 54, the first and second temporary gate structures (31, 27A, 21, 22, 27B), and the first and second dielectric gate spacers (52A, 52B) if (a) stress-generating liner(s) is/are not present. Preferably, the planarization dielectric layer 60 is a dielectric material that may be easily planarized. For example, the planarization dielectric layer 60 can be a doped silicate glass or an undoped silicate glass (silicon oxide).

The planarization dielectric layer 60, the first type stress-generating liner 58 and/or the second type stress-generating liner 56 (if present), and the dielectric liner 54 (if present) are planarized above the topmost surfaces of the first and second temporary gate structures (31, 27A, 21, 22, 27B), i.e., above the topmost surfaces of the first and second disposable gate material portions (27A, 27B). The planarization can be performed, for example, by chemical mechanical planarization (CMP). The planar topmost surface of the planarization dielectric layer 60 is herein referred to as a planar dielectric surface 63.

In one embodiment, the first conductivity type is p-type and the second conductivity type is n-type. The first source and drain extension regions 14A and the first source and drain regions 16A are p-doped, and the second conductivity type well 12A is n-doped. The combination of the first source and drain extension regions 14A, the first source and drain regions 16A, and the second conductivity type well 12A can be employed to subsequently form a p-type field effect transistor. Correspondingly, the first source and drain extension regions 14A and the first source and drain regions 16A are n-doped, and the second conductivity type well 12A is p-doped. The combination of the first source and drain extension regions 14A, the first source and drain regions 16A, and the second conductivity type well 12A can be employed to subsequently form an n-type field effect transistor. The first type stress-generating liner 58 can apply a tensile stress to the first channel, and the second type stress-generating liner 56 can apply a compressive stress to the second channel.

In another embodiment, the first conductivity type is n-type and the second conductivity type is p-type. The first source and drain extension regions 14A and the first source and drain regions 16A are n-doped, and the second conductivity type well 12A is p-doped. The combination of the first source and drain extension regions 14A, the first source and drain regions 16A, and the second conductivity type well 12A can be employed to subsequently form an n-type field effect transistor. Correspondingly, the first source and drain extension regions 14A and the first source and drain regions 16A are p-doped, and the second conductivity type well 12A is n-doped. The combination of the first source and drain extension regions 14A, the first source and drain regions 16A, and the second conductivity type well 12A can be employed to subsequently form a p-type field effect transistor. The first type stress-generating liner 58 can apply a compressive stress to the first channel, and the second type stress-generating liner 56 can apply a tensile stress to the second channel.

Figure 9:
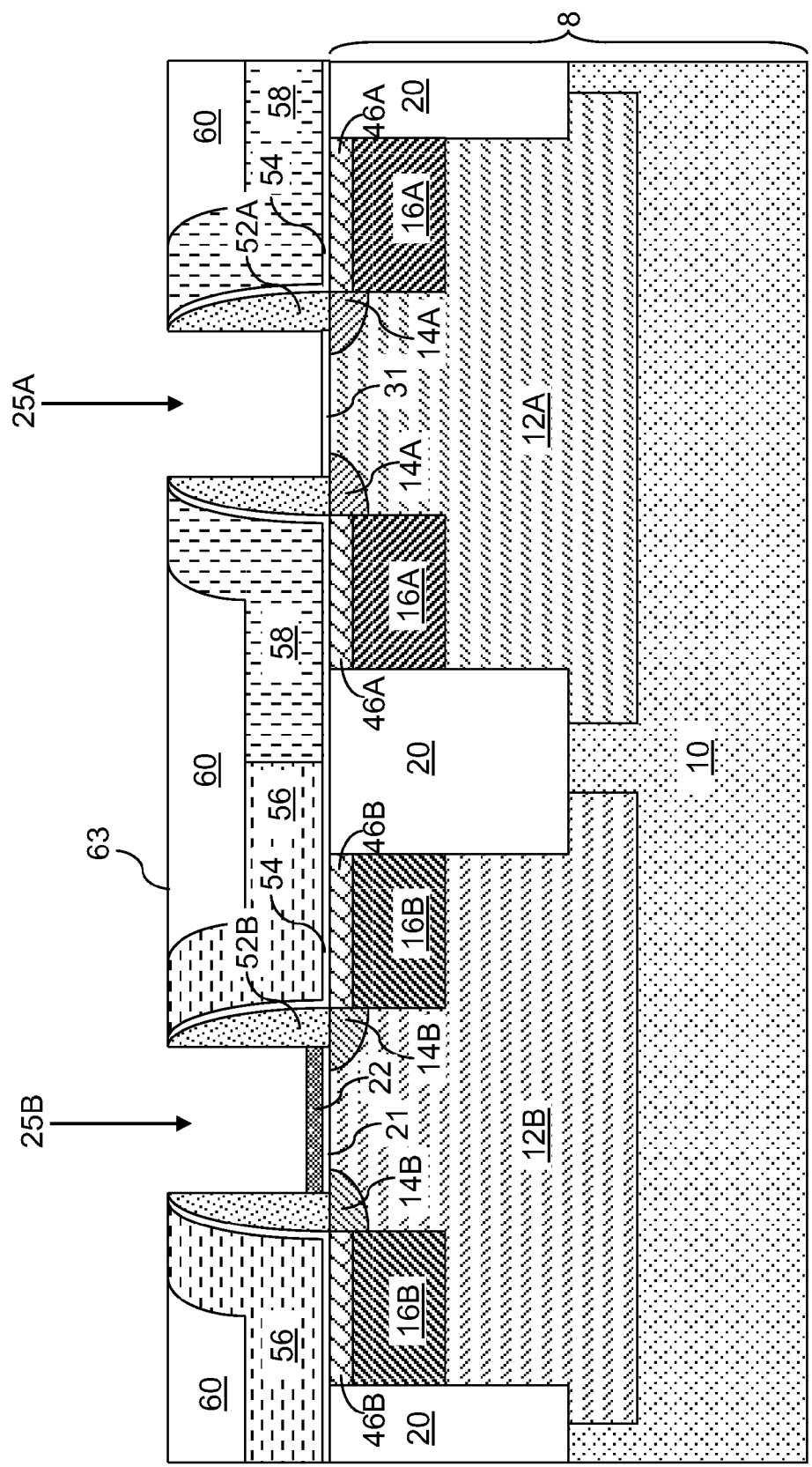
FIG. 9 is a vertical cross-sectional view of the first exemplary semiconductor structure of FIG. 8 after removal of the temporary gate structures.

Referring to FIG. 9, the first disposable gate material portion 27A and the second disposable gate material portion 27B are removed by at least one etch. The at least one etch can be a recess etch, which can be an isotropic etch or anisotropic etch. The etch employed to remove the first and second disposable gate material portions (27A, 27B) is preferably selective to the dielectric materials of the planar high dielectric constant material portion 22 and the first optional interfacial dielectric material portion 31, if present. The top surface of the first optional interfacial dielectric material portion 31, if present, or a top surface of the second conductivity type well 12A, is exposed in a first gate cavity 25A. The top surface of the planar high dielectric constant material portion 22 is exposed in a second gate cavity 25B.

Figure 10:
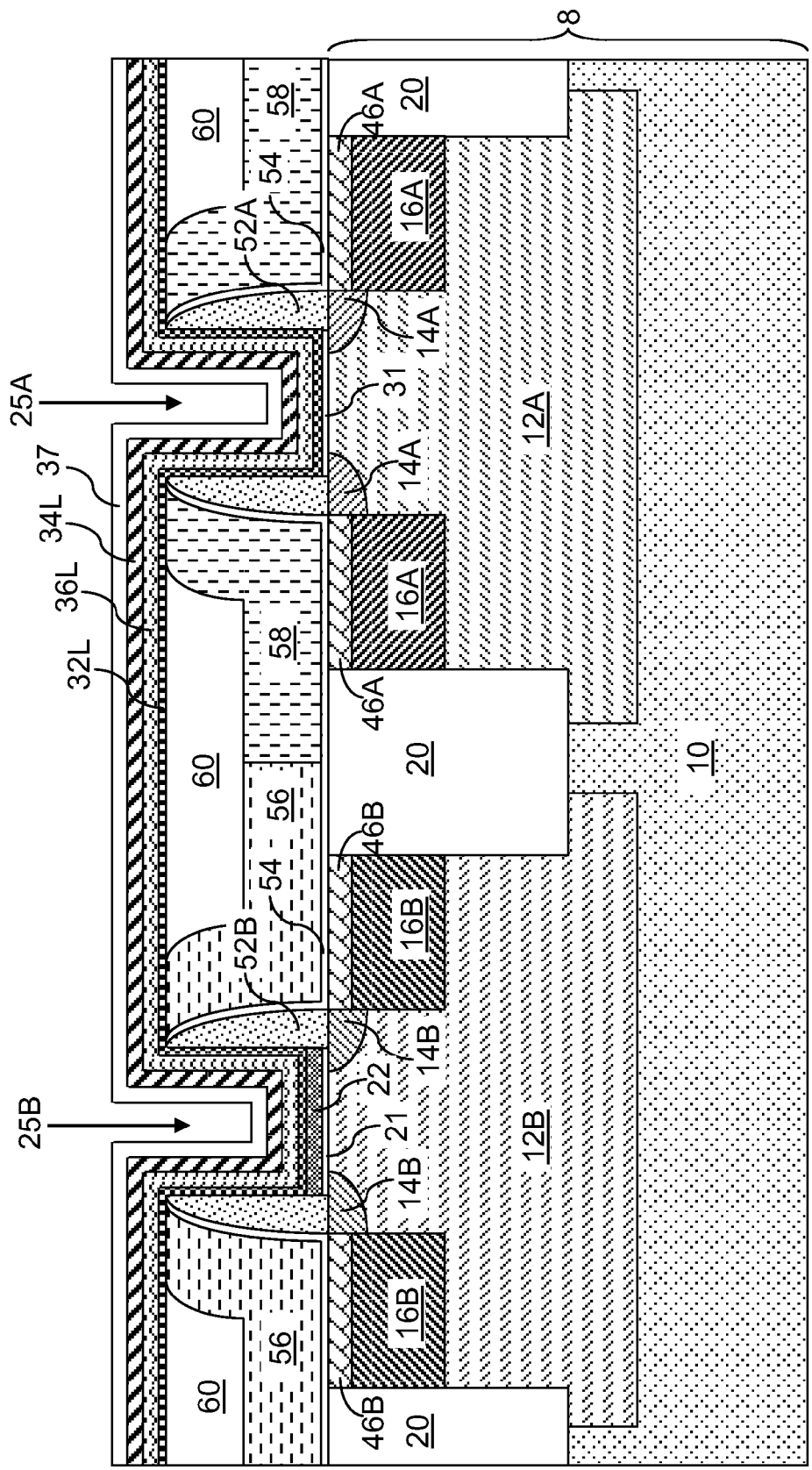
FIG. 10 is a vertical cross-sectional view of the first exemplary semiconductor structure of FIG. 9 after formation of a stack of a contiguous gate dielectric layer, a barrier metal layer, a first-type work function metal layer, and a dielectric masking layer.

Referring to FIG. 10, a contiguous gate dielectric layer 32L, a barrier metal layer 36L, a first-type work function metal layer 34L, and a dielectric masking layer 37 are sequentially deposited as a stack in the gate cavities (25A, 25B) and on the planar dielectric surface 63. The contiguous gate dielectric layer 32L can be a high dielectric constant (high-k) material layer having a dielectric constant greater than 8.0. The contiguous gate dielectric layer 32L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Any high-k dielectric material that can be employed for the high dielectric constant material layer 22A can be employed for the contiguous gate dielectric layer 32L. The thickness of the contiguous gate dielectric layer 32L, as measured at horizontal portions, can be from 0.5 nm to 6 nm, and preferably from 1.0 nm to 3 nm. The contiguous gate dielectric layer 32L may have an effective oxide thickness on the order of or less than 1 nm.

The barrier metal layer 36L includes a "metal," which refers to any of an elemental metal, an alloy of elemental metals, a conductive compound of an elemental metal and a non-metal element, and alloys and compounds thereof. The metal of the barrier metal layer 36 is selected to enable a subsequent selective etching of the material of the first-type work function metal layer 34L. As such, the metal of the barrier metal layer 36L and the metal of the first-type work function metal layer 34L are different materials.

The barrier metal layer 36L can be a layer of a mid band gap metal, semiconductor valence band edge metals, or semiconductor conduction band edge metals. A semiconductor valence band edge metal refers to a metal having a Fermi level near or below the valence band edge of the semiconductor material of the second conductivity type well 12A and the first conductivity type well 12B. A semiconductor conduction band edge metal refers to a metal having a Fermi level near or above the conduction band edge of the semiconductor material of the second conductivity type well 12A and the first conductivity type well 12B. Typically, the Fermi level of a metal is considered to be "near" the valence band edge or the conduction band edge if the Fermi level of the metal is within 0.25 eV of the valence band edge or the conduction band edge of a semiconductor material. A mid band gap metal refers to a metal having a Fermi level that is between, and more than 0.25 eV away from, the valence band edge and the conduction band edge of the semiconductor material of the second conductivity type well 12A and the first conductivity type well 12B.

For example, if the semiconductor material of the second conductivity type well 12A and the first conductivity type well 12B is silicon, the barrier metal layer 36L can be a layer of a mid band gap metal such as Ag, Mo, Ta, Re, Hg, Fe, Ru, alloys thereof, and conductive compounds thereof; or semiconductor valence band edge metals such as Pt, Rh, Ir, Ru, Cu, Os, Be, Co, Pd, Te, Cr, Ni, TiN, and alloys thereof; or semiconductor conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl (i.e., an alloy of Ti and Al), and alloys thereof. Conductive compounds can be a conductive metal oxide, a conductive metal nitride, or a conductive metal oxynitride. In one embodiment, the barrier metal layer 36L is a layer of TaN.

The barrier metal layer 36L can be formed, for example, by physical vapor deposition (PVD, i.e., sputtering), chemical vapor deposition, or atomic layer deposition (ALD). The barrier metal layer 36L is thin enough to allow the energy band at the bottom of the barrier metal layer 36L to be affected by the composition of the material of the first-type work function metal layer 34L. In order to ensure that the material of the first-type work function metal layer 34L causes significant band bending at the bottom of the barrier metal layer 36L, the thickness of the barrier metal layer 36L is typically set at a value from 0.5 nm to 5 nm, and more typically, from 1 nm to 3 nm.

The first-type work function metal layer 34L includes a first metal, which has a first work function. The material of the first-type work function metal layer 34L is different from the material of the barrier metal layer 36L, and is selected to be a metal that can be etched selective to the metal of the barrier metal layer 36L. The first metal of the first-type work function metal layer 34L is selected to optimize the performance of a transistor to be subsequently formed employing the first source and drain extension regions 14A, the first source and drain regions 16A, and the second conductivity type well 12A.

In one embodiment, the first conductivity type is p-type and the semiconductor material of the second conductivity type well 12A includes n-doped silicon, and the first-type work function metal layer 34L includes a silicon valence band edge metals such as Pt, Rh, Ir, Ru, Cu, Os, Be, Co, Pd, Te, Cr, Ni, TiN, and alloys thereof. For example, the first-type work function metal layer 34L can be a layer of TiN.

In another embodiment, the first conductivity type is n-type and the semiconductor material of the second conductivity type well 12A includes p-doped silicon, and the first-type work function metal layer 34L includes a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. For example, the first-type work function metal layer 34L can be a layer of TiAl.

The first-type work function metal layer 34L can be formed, for example, by physical vapor deposition, chemical vapor deposition, or atomic layer deposition (ALD). The first-type work function metal layer 34L is thick enough to significantly affect the energy band at the bottom of the barrier metal layer 36L. In order to ensure that the material of the first-type work function metal layer 34L causes significant band bending at the bottom of the barrier metal layer 36L, the thickness of the first-type work function metal layer 34L is typically set at a value from 2 nm to 30 nm, and more typically, from 3 nm to 10 nm, although lesser and greater thicknesses can also be employed.

The dielectric masking layer 37 includes a dielectric material such as silicon oxide, silicon nitride, or silicon oxynitride. The dielectric masking layer 37 can be deposited, for example, by chemical vapor deposition (CVD), or atomic layer deposition (ALD). The thickness of the dielectric masking layer can be from 1 nm to 30 nm, and typically from 2 nm to 15 nm, although lesser and greater thicknesses can also be employed.

Figure 11:
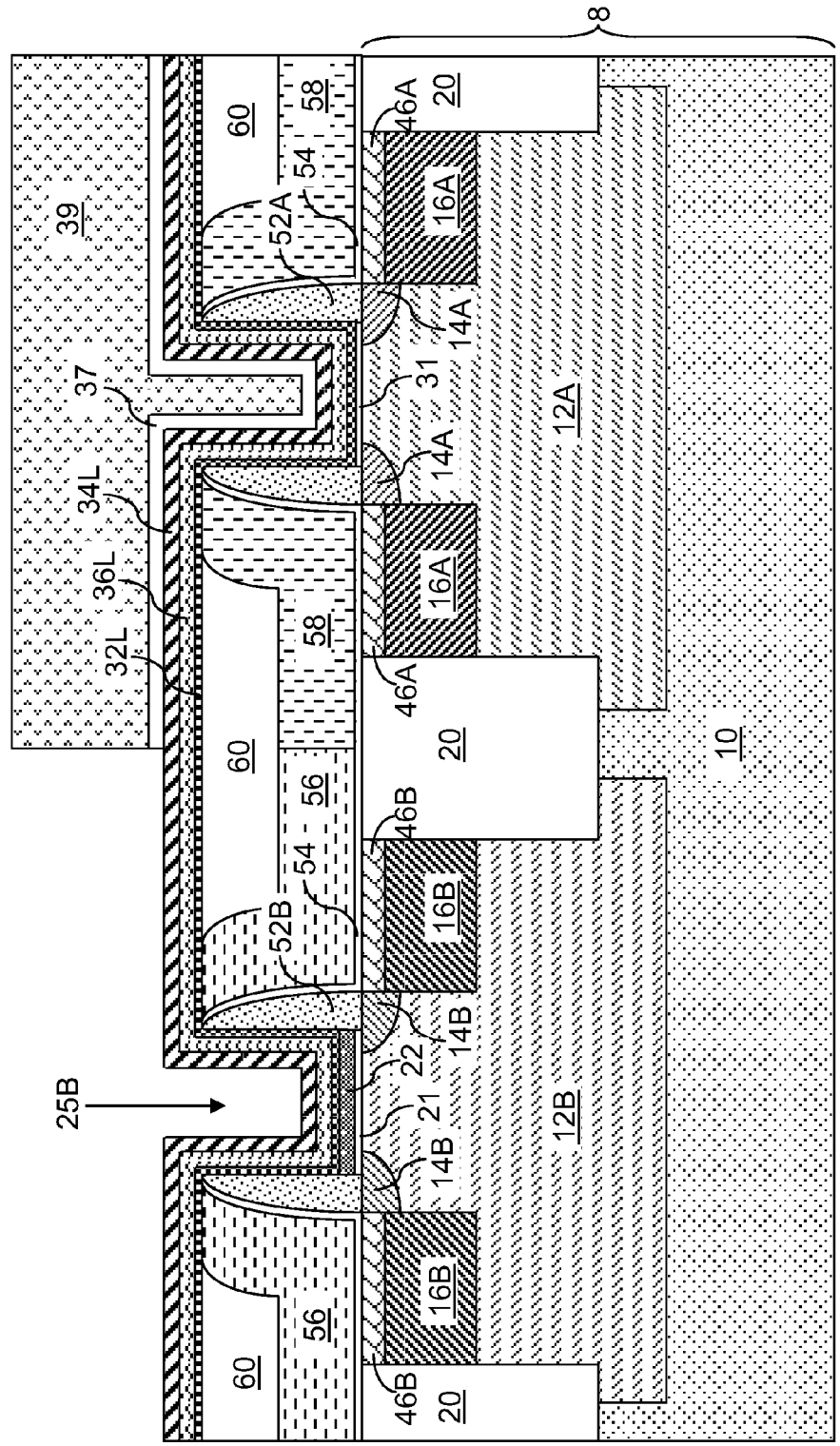
FIG. 11 is a vertical cross-sectional view of the first exemplary semiconductor structure of FIG. 10 after application of a photoresist and lithographic patterning of the dielectric masking layer.

Referring to FIG. 11, a photoresist 39 is applied over the dielectric masking layer 37 and lithographic patterned so that the photoresist 39 covers the area over the second conductivity type well 12A, while the top surface of the dielectric masking layer 37 is exposed over the first conductivity type well 12B. The pattern in the photoresist 39 is transferred into the dielectric masking layer 37 by an etch, so that the exposed portion of the dielectric masking layer 37 is removed from within the second gate cavity 25B and a surrounding area thereabout.

Figure 12:
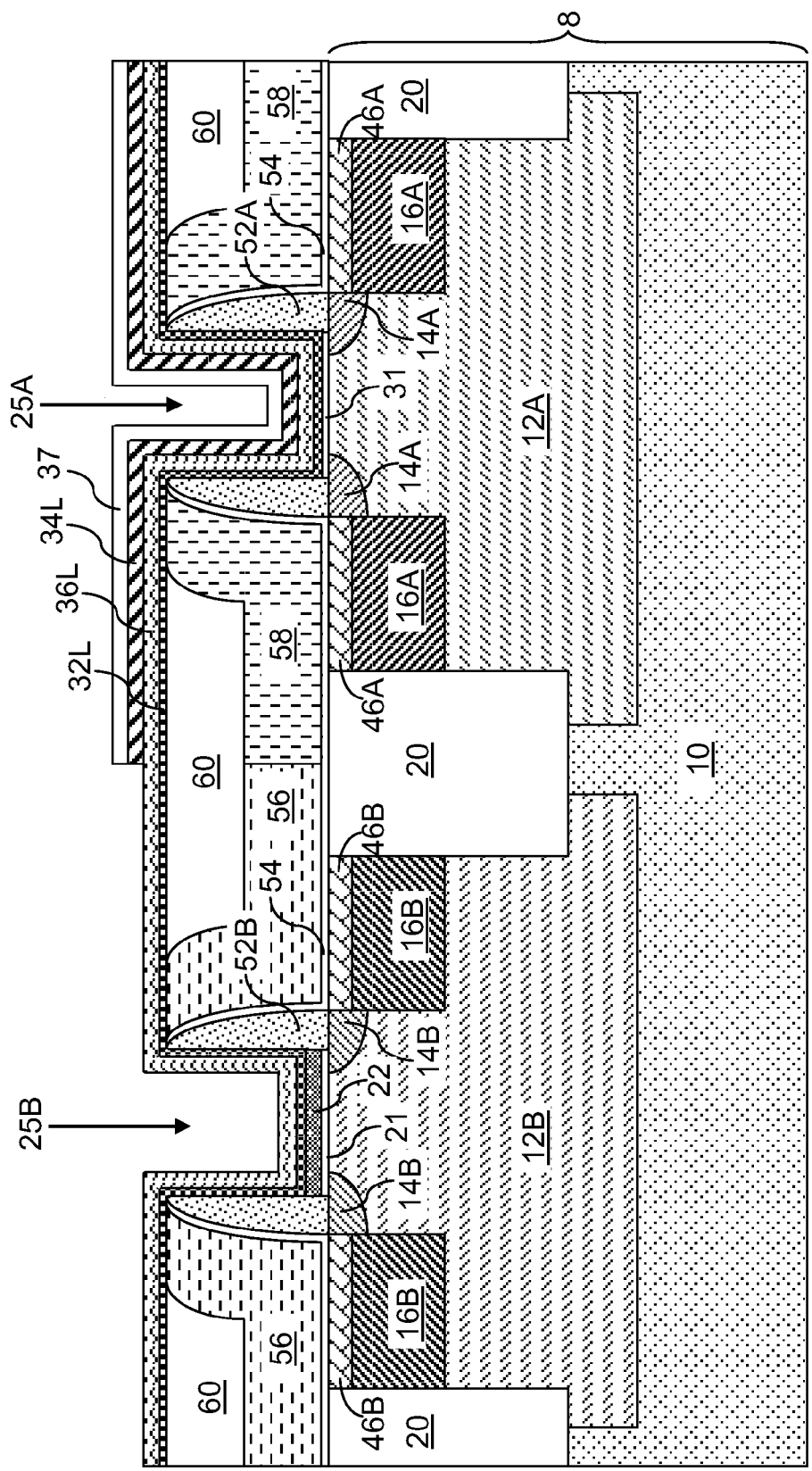
FIG. 12 is a vertical cross-sectional view of the first exemplary semiconductor structure of FIG. 11 after removal of the photoresist and patterning of the first-type work function metal layer employing the dielectric masking layer as an etch mask.

Referring to FIG. 12, the photoresist 39 is removed, for example, by ashing or wet chemistries. The dielectric masking layer 37 is employed as an etch mask to remove the exposed portion of the first-type work function metal layer 34L from above the first conductivity type well 12B. Specifically, the portion of the first-type work function metal layer 34L is removed from within the second gate cavity 25B employing the remaining portion of the dielectric masking layer 37 as an etch mask during the patterning of the first-type work function metal layer 34L. After the patterning of the first-type work function metal layer 34L, the first-type work function metal layer 34L is present in the first gate cavity 25A, and the barrier metal layer 36L is exposed in the second gate cavity 25B.

Figure 13:
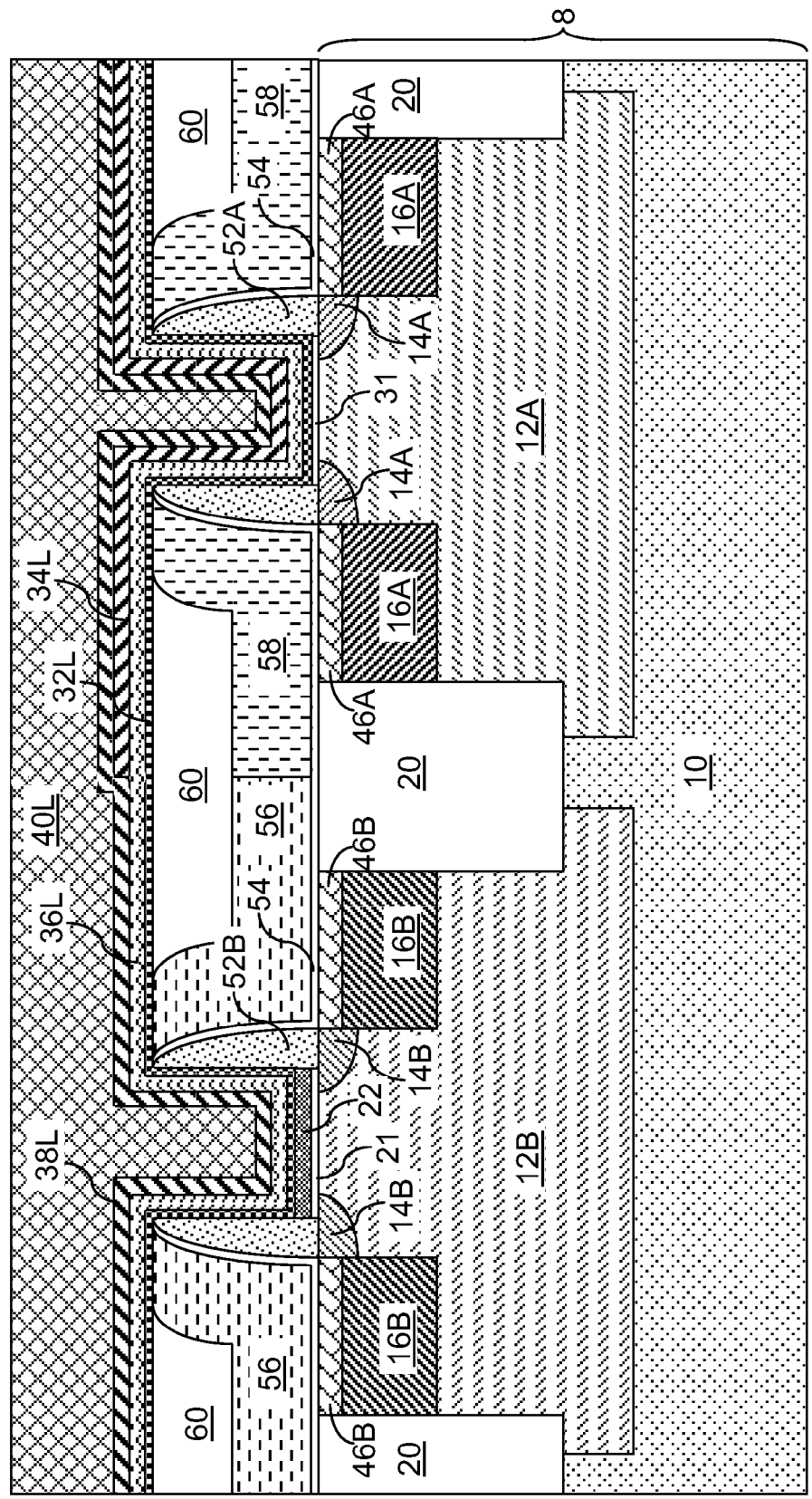
FIG. 13 is a vertical cross-sectional view of the first exemplary semiconductor structure of FIG. 12 after formation of a second-type work function metal layer and a gate conductor layer.

Referring to FIG. 13, the dielectric masking layer 37 is removed selective to the barrier metal layer 36L and the first-type work function metal layer 34L. A second-type work function metal layer 38L and a gate conductor layer 40L are deposited on the exposed surfaces of the barrier metal layer 36L and the first-type work function metal layer 34L. The second-type work function metal layer 38L includes a second metal having a second work function, which is different from the first work function. The second metal of the second-type work function metal layer 38L is selected to optimize the performance of a transistor to be subsequently formed employing the second source and drain extension regions 14B, the second source and drain regions 16B, and the first conductivity type well 12B.

In one embodiment, the second conductivity type is n-type and the semiconductor material of the first conductivity type well 12B includes p-doped silicon, and the second-type work function metal layer 38L includes a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. For example, the second-type work function metal layer 38L can be a layer of TiAl.

In another embodiment, the second conductivity type is p-type and the semiconductor material of the first conductivity type well 12B includes n-doped silicon, and the second-type work function metal layer 38L includes a silicon valence band edge metals such as Pt, Rh, Ir, Ru, Cu, Os, Be, Co, Pd, Te, Cr, Ni, TiN, and alloys thereof. For example, the second-type work function metal layer 38L can be a layer of TiN.

The second-type work function metal layer 38L can be formed, for example, by physical vapor deposition, chemical vapor deposition, or atomic layer deposition (ALD). The second-type work function metal layer 38L is thick enough to significantly affect the energy band at the bottom of the portion of the barrier metal layer 36L that contacts the second-type work function metal layer 38L, i.e., within the second gate cavity 25B. In order to ensure that the material of the second-type work function metal layer 38L causes significant band bending at the bottom of the barrier metal layer 36L, the thickness of the second-type work function metal layer 34L is typically set at a value from 2 nm to 100 nm, and more typically, from 3 nm to 10 nm, although lesser and greater thicknesses can also be employed.

In one embodiment, one of the first and second work functions is closer to the conduction band of the semiconductor material of the first conductivity type well 12B and the second conductivity type well 12A than the valence band of that semiconductor material, and the other of the first and second work functions is closer to the valence band than to the conduction band of that material. Typically, the work function that is closer to the conduction band than to the valence band of the semiconductor material is employed to enhance the performance of an n-type field effect transistor, and the work function that is closer to the valence band than to the conduction band of the semiconductor material is employed to enhance the performance of a p-type field effect transistor.

The gate conductor layer 40L is deposited on the second-type work function metal layer 38L, for example, by chemical vapor deposition, physical vapor deposition, or a combination thereof. The first and second gate cavities (25A, 25B) are completely filled by the gate conductor layer 40L. The gate conductor layer 40L includes a conductive material such as a metal or a doped semiconductor material.

Figure 14:
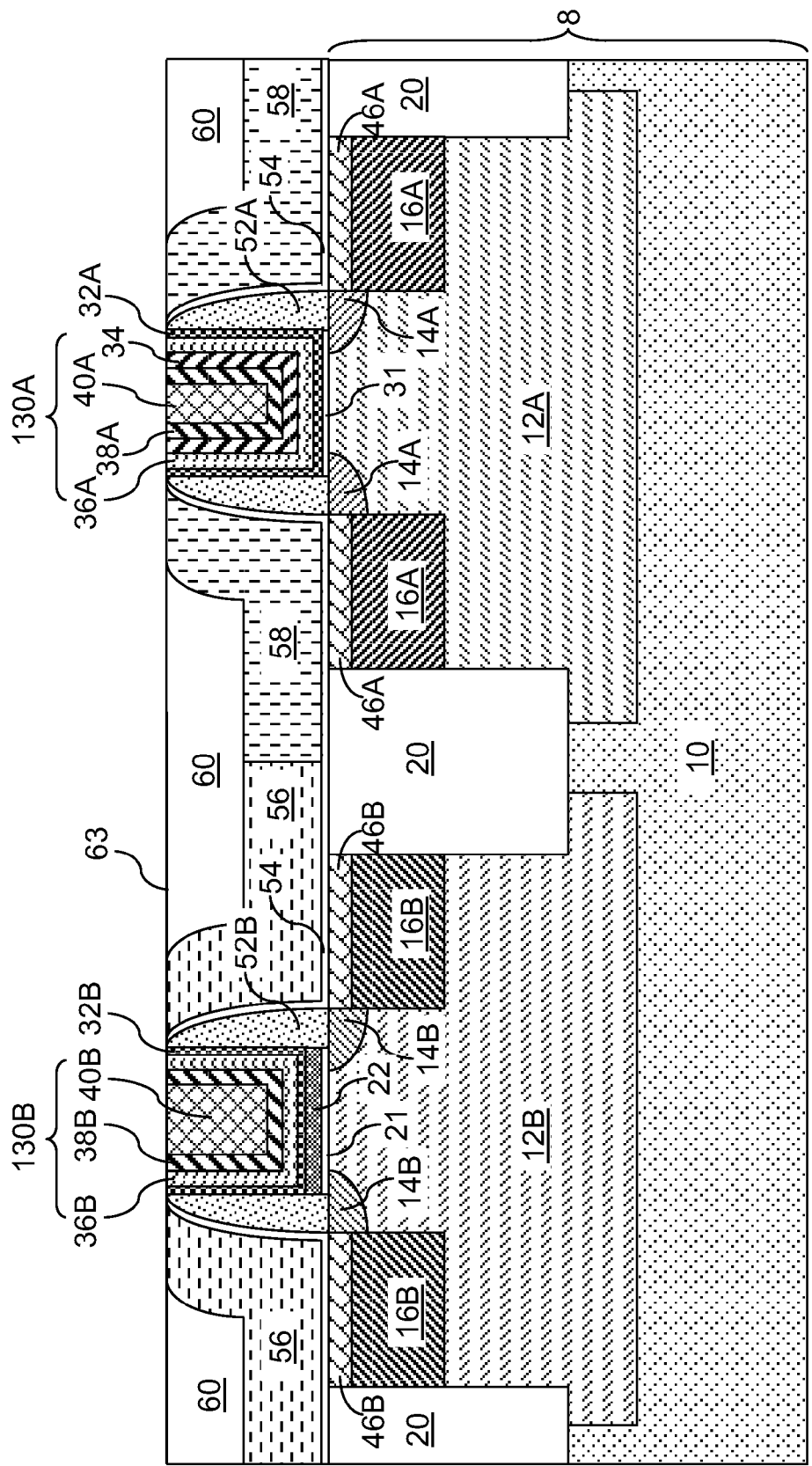
FIG. 14 is a vertical cross-sectional view of the first exemplary semiconductor structure of FIG. 13 after removal of materials above the planar dielectric surface to form gate structures.

Referring to FIG. 14, portions of the gate conductor layer 40L, the second-type work function metal layer 38L, the first-type work function metal layer 34L, the barrier metal layer 36L, and the portion of the contiguous gate dielectric layer 32L are removed from above the planar dielectric surface 63 of the planarization dielectric layer 63 by employing a planarization process.

A first field effect transistor is formed in the region of the second conductivity type well 12A. The first field effect transistor includes the second conductivity type well 12A, the first source and drain extension regions 14A, the first source and drain regions 16A, a first metal semiconductor alloy regions 46A, a first gate dielectric, a first barrier metal portion 36A which is a remaining portion of the barrier metal layer 36L, a first-type work function metal portion 34 which is a remaining portion of the first-type work function metal layer 34L, a first second-type work function metal portion 38A which is a remaining portion of the second-type work function metal layer 38L, and a first gate conductor portion 40A which is a remaining portion of the gate conductor layer 40L.

The first gate dielectric can include the first optional interfacial dielectric material portion 31 and a first U-shaped gate dielectric portion 32A that is a remaining portion of the contiguous gate dielectric layer 32L. In one embodiment, the first optional interfacial dielectric material portion 31 is present and the first gate dielectric includes a first interfacial dielectric material portion 31 and the first U-shaped gate dielectric portion 32A. In another embodiment, a first optional interfacial dielectric material portion 31 is not present and the first gate dielectric includes only the first U-shaped gate dielectric portion 32A. The first second-type work function metal portion 38A includes the second metal and contacts the first-type work function metal portion 34 that includes the first metal.

A second field effect transistor is formed in the region of the first conductivity type well 12B. The second field effect transistor includes the first conductivity type well 12B, the second source and drain extension regions 14B, the second source and drain regions 16B, a second metal semiconductor alloy regions 46B, a second gate dielectric, a second barrier metal portion 36B which is a remaining portion of the barrier metal layer 36L, a second second-type work function metal portion 38B which is a remaining portion of the second-type work function metal layer 38L, and a second gate conductor portion 40B which is a remaining portion of the gate conductor layer 40L. The second second-type work function metal portion 38B includes the second metal and contacts the second barrier metal portion 36B, which has the same thickness as, and includes the same material as, the first barrier metal portion 36A.

The second gate dielectric can include the second optional interfacial dielectric material portion 21, the planar high dielectric constant material portion 22, and a second U-shaped gate dielectric 32B that is a remaining portion of the contiguous gate dielectric layer 32L. In one embodiment, the second optional interfacial dielectric material portion 21 is present and the second gate dielectric includes a second interfacial dielectric material portion 21, the planar high dielectric constant material portion 22, and the second U-shaped gate dielectric portion 32B. In another embodiment, a second optional interfacial dielectric material portion 21 is not present and the second gate dielectric includes only the planar high dielectric constant material portion 22 and the first U-shaped gate dielectric portion 32A.

Each of the first and second U-shaped gate dielectric portions (32A, 32B) includes a horizontal gate dielectric portion and a vertical gate dielectric portion extending upward from peripheral regions of the horizontal gate dielectric portion. In the first field effect transistor, the first barrier metal portion 36A contacts inner sidewalls of the vertical gate dielectric portion of the first U-shaped gate dielectric portion 32A. In the second field effect transistor, the second barrier metal portion 36B contacts inner sidewalls of the vertical gate dielectric portion of the second U-shaped gate dielectric portion 32B.

The first gate conductor portion 40A contacts an upper surface and inner sidewalls of the first second-type work function metal portion 38A. The second gate conductor portion 40B contacts an upper surface and inner sidewalls of the second second-type work function metal portion 38B. The first and second barrier metal portions (36A, 36B) include the same metal. The metal of the first and second barrier metal portions (36A, 36B) may, or may not, have a work function that is between the first work function and the second work function.

The work function of the gate electrode in the first field effect transistors is primarily determined by the composition of the first-type work function metal portion 34, and is affected by the composition and thickness of the first barrier metal portion 36A. The leakage current level between the gate electrode and the channel in the first field effect transistor is determined by the composition and thickness of the horizontal portion of the first U-shaped gate dielectric portion 32A and the composition and thickness of the first optional interfacial dielectric material portion 31. The work function of the gate electrode in the second field effect transistors is primarily determined by the composition of the second second-type work function metal portion 38B, and is affected by the composition and thickness of the second barrier metal portion 36B. The leakage current level between the gate electrode and the channel in the second field effect transistor is determined by the composition and thickness of the horizontal portion of the second U-shaped gate dielectric portion 32B, the composition and thickness of the planar high dielectric constant material portion 22, and the composition and thickness of the second optional interfacial dielectric material portion 21. Thus, the work functions and the leakage current levels of the first and second field effect transistors can be optimized independently to provide a complementary metal oxide semiconductor (CMOS) circuit, in which p-type field effect transistors and n-type field effect transistors are independently optimized for the leakage current level and the work function.

The horizontal portion of the second gate dielectric (21, 22, 32B) has a different thickness than the horizontal portion of the first gate dielectric (31, 32A) due to the presence of the planar high dielectric constant material portion 22 only in the second gate dielectric (21, 22, 32B) and not in the first gate dielectric (31, 32A). The second gate dielectric (21, 22, 32B) includes the second U-shaped gate dielectric portion 32B and the planar high dielectric constant material portion 22 having a constant thickness throughout. The first gate dielectric (31, 32A) includes the first U-shaped gate dielectric portion 32A and does not include any planar high dielectric constant material portion. The first U-shaped gate dielectric portion 32A and the second U-shaped gate dielectric portion 32B have the same composition and thickness in the horizontal portions thereof. As discussed above, the planar high dielectric constant material portion 22 can have a different composition than the first and second U-shaped gate dielectric portions (32A, 32B).

In one embodiment, the second interfacial dielectric material portion 21 and the first interfacial dielectric material portion 31 are present, and the second gate dielectric (21, 22, 32B) includes a vertical stack, from bottom to top, of the second interfacial dielectric material portion 21, the planar high dielectric constant material portion 22, and the second U-shaped gate dielectric portion 32B, and the first gate dielectric (31, 32A) can includes a vertical stack, from bottom to top, of the first interfacial dielectric material portion 31 and the first U-shaped gate dielectric portion 32A without any high dielectric constant material therebetween. In this embodiment, the second interfacial dielectric material portion 21 and the first interfacial dielectric material portion 31 can have a same composition and a same thickness. In another embodiment, the second interfacial dielectric material portion 21 and the first interfacial dielectric material portion 31 can be omitted, and the second gate dielectric (22, 32B) includes a vertical stack, from bottom to top, of the planar high dielectric constant material portion 22 and the second U-shaped gate dielectric portion 32B, and the first gate dielectric 32A can includes only the first U-shaped gate dielectric portion 32A that contacts the second conductivity type well 12A.

Contact via structures (not shown) can be formed, for example, by formation of contact via cavities by a combination of lithographic patterning and an anisotropic etch followed by deposition of a conductive material and planarization that removes an excess portion of the conductive material from above the planar dielectric surface 63.

Figure 15:
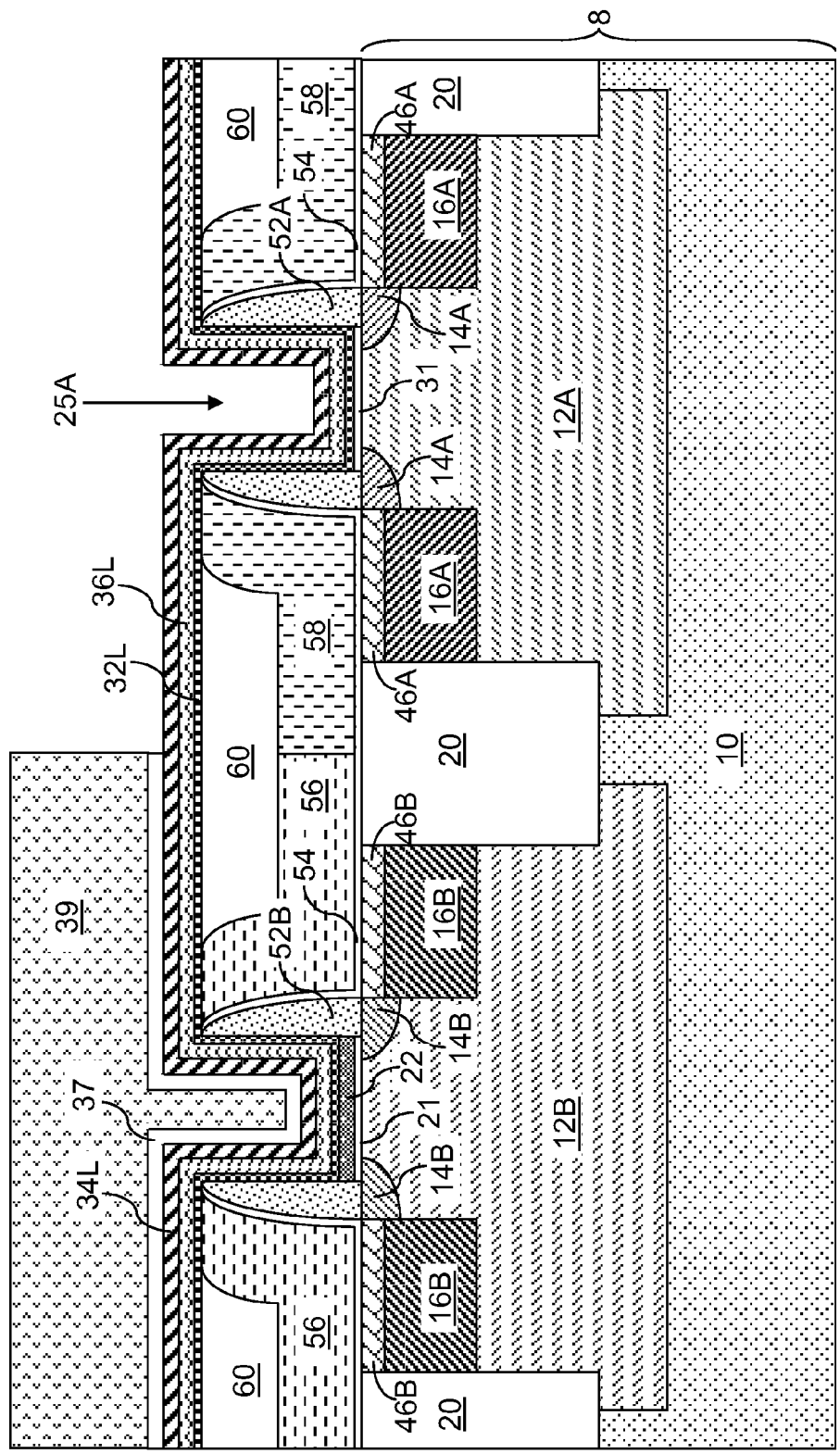
FIG. 15 is a vertical cross-sectional view of a second exemplary semiconductor structure, which is derived from the first exemplary semiconductor structure of FIG. 10 by applying a photoresist and lithographic patterning the dielectric masking layer according to a second embodiment of the present disclosure.

Referring back to FIG. 10, in a second embodiment of the present disclosure, the first metal of the first-type work function metal layer 34L can be selected to optimize the performance of a transistor to be subsequently formed employing the second source and drain extension regions 14B, the second source and drain regions 16B, and the first conductivity type well 12B at a processing step corresponding to FIG. 10. Specifically, a second exemplary semiconductor structure according to the second embodiment of the present disclosure is derived from the first exemplary semiconductor structure of FIG. 10 by selecting the first metal of the first-type work function metal layer 34L to optimize the performance of a transistor to be subsequently formed employing the second source and drain extension regions 14B, the second source and drain regions 16B, and the first conductivity type well 12B, and by applying a photoresist 39 and lithographic patterning the dielectric masking layer 37 as illustrated in FIG. 15.

The photoresist 39 is applied over the dielectric masking layer 37 and lithographic patterned so that the photoresist 39 covers the area over the first conductivity type well 12B, while the top surface of the dielectric masking layer 37 is exposed over the second conductivity type well 12A. The pattern in the photoresist 39 is transferred into the dielectric masking layer 37 by an etch, so that the exposed portion of the dielectric masking layer 37 is removed from within the first gate cavity 25A and a surrounding area thereabout. In other words, the patterned photoresist 39 in FIG. 16 covers the complement of the area covered by the patterned photoresist 39 in FIG. 11.

Figure 16:
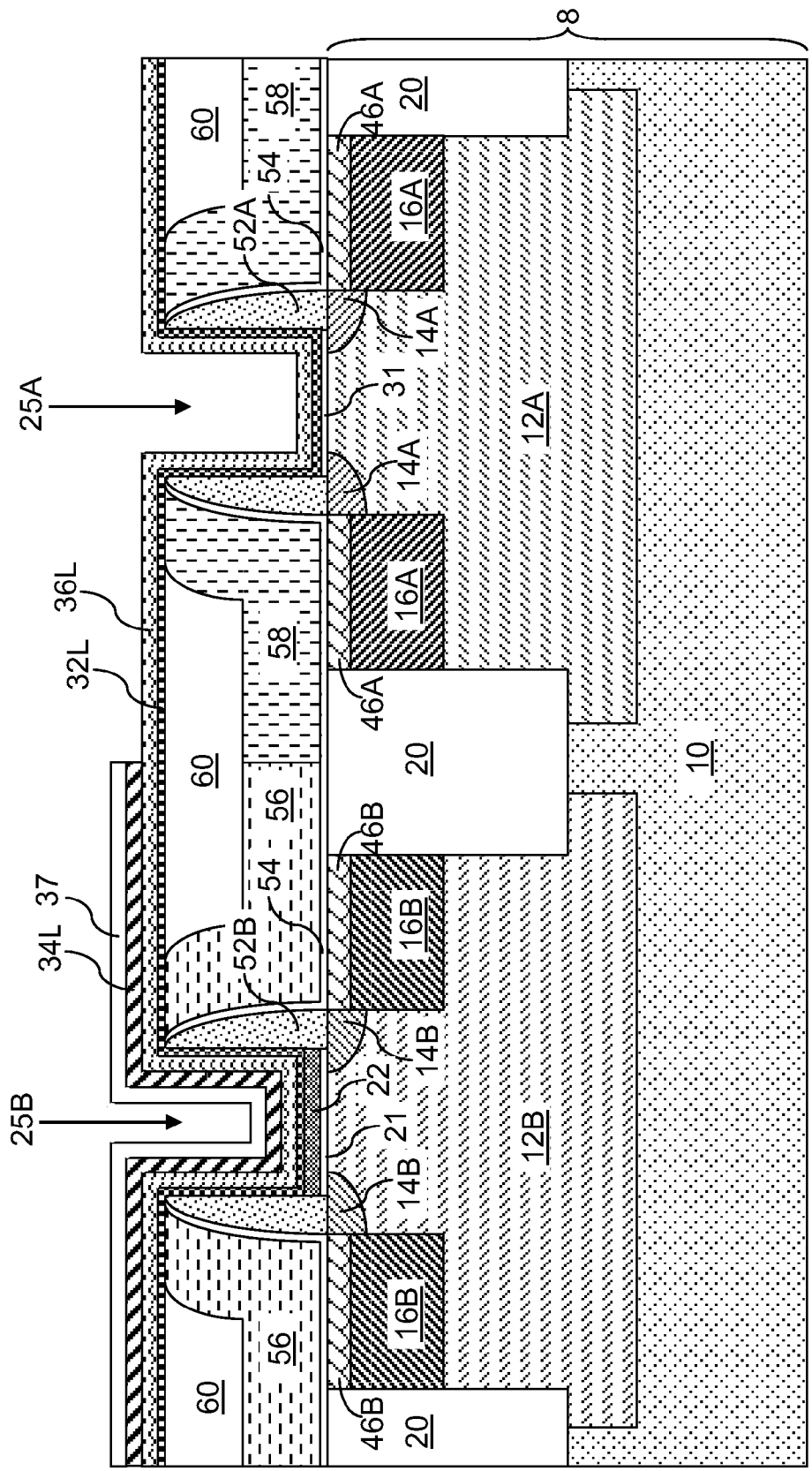
FIG. 16 is a vertical cross-sectional view of the second exemplary semiconductor structure of FIG. 15 after removal of the photoresist and patterning of the first-type work function metal layer employing the dielectric masking layer as an etch mask.

Referring to FIG. 16, the photoresist 39 is removed, for example, by ashing or wet chemistries. The dielectric masking layer 37 is employed as an etch mask to remove the exposed portion of the first-type work function metal layer 34L from above the second conductivity type well 12A. Specifically, the portion of the first-type work function metal layer 34L is removed from within the first gate cavity 25A employing the remaining portion of the dielectric masking layer 37 as an etch mask during the patterning of the first-type work function metal layer 34L. After the patterning of the first-type work function metal layer 34L, the first work function metal layer 34L is present in the second gate cavity 25B, and the barrier metal layer 36L is exposed in the first gate cavity 25A.

Figure 17:
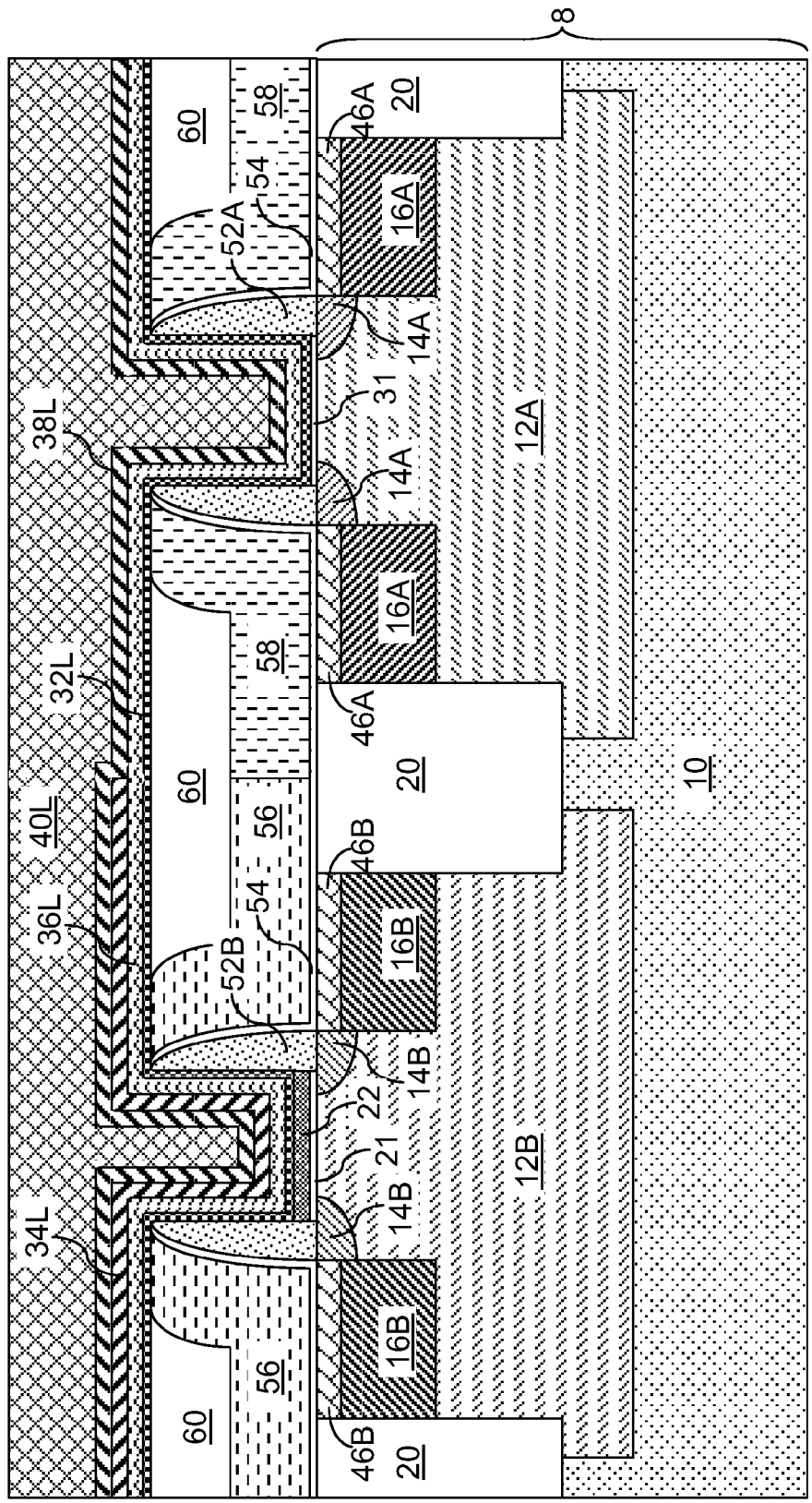
FIG. 17 is a vertical cross-sectional view of the second exemplary semiconductor structure of FIG. 16 after formation of a second-type work function metal layer and a gate conductor layer.

Referring to FIG. 17, the dielectric masking layer 37 is removed selective to the barrier metal layer 36L and the first-type work function metal layer 34L. A second-type work function metal layer 38L and a gate conductor layer 40L are deposited on the exposed surfaces of the barrier metal layer 36L and the first-type work function metal layer 34L. The second-type work function metal layer 38L includes a second metal having a second work function, which is different from the first work function. The second metal of the second-type work function metal layer 38L is selected to optimize the performance of a transistor to be subsequently formed employing the first source and drain extension regions 14A, the first source and drain regions 16A, and the second conductivity type well 12A. The semiconductor material of the first conductivity type well 12B and the material of the second-type work function metal layer 38L can be selected in the same manner as in the first embodiment to optimize the performance of the transistor to be subsequently formed employing the first source and drain extension regions 14A, the first source and drain regions 16A, and the second conductivity type well 12A. A gate conductor layer 40L can be deposited on the second-type work function metal layer 38L in the same manner as in the first embodiment.

Figure 18:
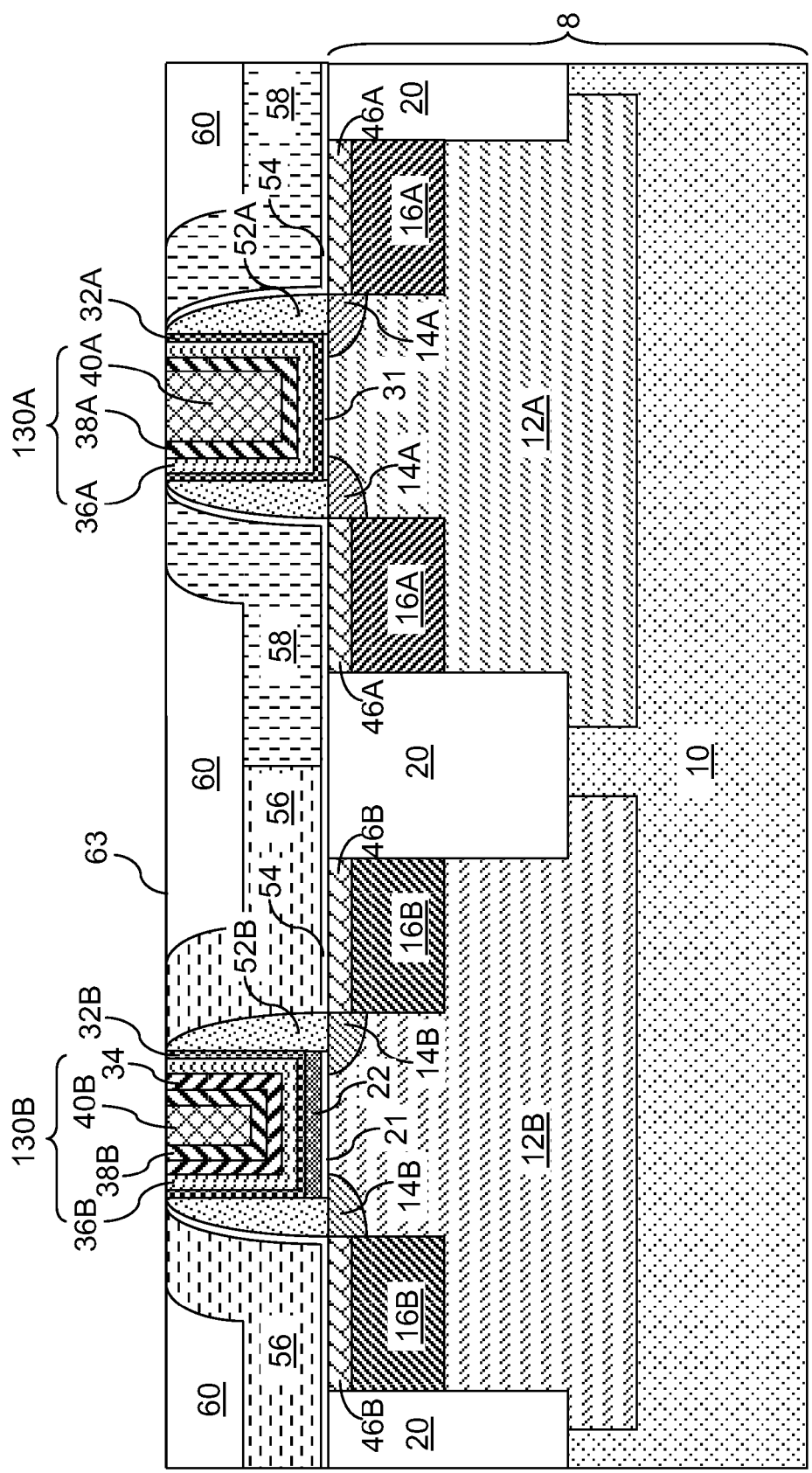
FIG. 18 is a vertical cross-sectional view of the second exemplary semiconductor structure of FIG. 17 after removal of materials above the planar dielectric surface to form gate structures.

Referring to FIG. 18, portions of the gate conductor layer 40L, the second-type work function metal layer 38L, the first-type work function metal layer 34L, the barrier metal layer 36L, and the portion of the contiguous gate dielectric layer 32L are removed from above the planar dielectric surface 63 of the planarization dielectric layer 63 by employing a planarization process.

A first field effect transistor is formed in the region of the second conductivity type well 12A. The first field effect transistor includes the second conductivity type well 12A, the first source and drain extension regions 14A, the first source and drain regions 16A, a first metal semiconductor alloy regions 46A, a first gate dielectric, a first barrier metal portion 36A which is a remaining portion of the barrier metal layer 36L, a first second-type work function metal portion 38A which is a remaining portion of the second-type work function metal layer 38L, and a first gate conductor portion 40A which is a remaining portion of the gate conductor layer 40L.

The first gate dielectric can include the first optional interfacial dielectric material portion 31 and a first U-shaped gate dielectric portion 32A that is a remaining portion of the contiguous gate dielectric layer 32L. In one embodiment, the first optional interfacial dielectric material portion 31 is present and the first gate dielectric (31, 32A) includes a first interfacial dielectric material portion 31 and the first U-shaped gate dielectric portion 32A. In another embodiment, a first optional interfacial dielectric material portion 31 is not present and the first gate dielectric includes only the first U-shaped gate dielectric portion 32A. The first second-type work function metal portion 38A includes the second metal and contacts the first barrier metal portion 36A.

A second field effect transistor is formed in the region of the first conductivity type well 12B. The second field effect transistor includes the first conductivity type well 12B, the second source and drain extension regions 14B, the second source and drain regions 16B, a second metal semiconductor alloy regions 46B, the optional second semiconductor-element-containing dielectric layer 21, a second gate dielectric, a second barrier metal portion 36B which is a remaining portion of the barrier metal layer 36L, a first-type work function metal portion 34 which is a remaining portion of the first-type work function metal layer 34L, a second second-type work function metal portion 38B which is a remaining portion of the second-type work function metal layer 38L, and a second gate conductor portion 40B which is a remaining portion of the gate conductor layer 40L. The first second-type work function metal portion 38A includes the second metal and contacts the first barrier metal portion 36A, which has the same thickness as, and includes the same material as, the second barrier metal portion 36B.

The second gate dielectric can include the second optional interfacial dielectric material portion 21, the planar high dielectric constant material portion 22, and a second U-shaped gate dielectric 32B that is a remaining portion of the contiguous gate dielectric layer 32L. In one embodiment, the second optional interfacial dielectric material portion 21 is present and the second gate dielectric (21, 22, 32B) includes a second interfacial dielectric material portion 21, the planar high dielectric constant material portion 22, and the second U-shaped gate dielectric portion 32B. In another embodiment, a second optional interfacial dielectric material portion 21 is not present and the second gate dielectric (22, 32A) includes only the planar high dielectric constant material portion 22 and the first U-shaped gate dielectric portion 32A.

Each of the first and second U-shaped gate dielectric portions (32A, 32B) includes a horizontal gate dielectric portion and a vertical gate dielectric portion extending upward from peripheral regions of the horizontal gate dielectric portion. In the first field effect transistor, the first barrier metal portion 36A contacts inner sidewalls of the vertical gate dielectric portion of the second U-shaped gate dielectric portion 32B. In the second field effect transistor, the second barrier metal portion 36B contacts inner sidewalls of the vertical gate dielectric portion of the first U-shaped gate dielectric portion 32A.

The work function of the gate electrode in the first field effect transistors is primarily determined by the composition of the second second-type work function metal portion 38B, and is affected by the composition and thickness of the second barrier metal portion 36B. The leakage current level between the gate electrode and the channel in the first field effect transistor is determined by the composition and thickness of the horizontal portion of the first U-shaped gate dielectric portion 32A and the composition and thickness of the first optional interfacial dielectric material portion 31. The work function of the gate electrode in the second field effect transistors is primarily determined by the composition of the first-type work function metal portion 34, and is affected by the composition and thickness of the first barrier metal portion 36A. The leakage current level between the gate electrode and the channel in the second field effect transistor is determined by the composition and thickness of the horizontal portion of the second U-shaped gate dielectric portion 32B, the composition and thickness of the planar high dielectric constant material portion 22, and the composition and thickness of the second optional interfacial dielectric material portion 21. Thus, the work functions and the leakage current levels of the first and second field effect transistors can be optimized independently to provide a complementary metal oxide semiconductor (CMOS) circuit, in which p-type field effect transistors and n-type field effect transistors are independently optimized for the leakage current level and the work function.

The horizontal portion of the second gate dielectric (21, 22, 32B) has a different thickness than the horizontal portion of the first gate dielectric (31, 32A) due to the presence of the planar high dielectric constant material portion 22 only in the second gate dielectric (21, 22, 32B) and not in the first gate dielectric (31, 32A). Remarks for FIG. 14 concerning the geometry of the second gate dielectric (21, 22, 32B) and the first gate dielectric (31, 32A) of the first exemplary semiconductor structure apply to the second exemplary semiconductor structure of FIG. 19 mutatis mutandis.

Contact via structures (not shown) can be formed, for example, by formation of contact via cavities by a combination of lithographic patterning and an anisotropic etch followed by deposition of a conductive material and planarization that removes an excess portion of the conductive material from above the planar dielectric surface 63.

In a third embodiment of the present disclosure, the first exemplary structure and the second exemplar structure of the present invention can be formed on a same semiconductor substrate. Thus, four types of field effect transistors can be formed in the same substrate. The first type field effect transistor can include the first transistor of the first embodiment as shown in FIG. 14, the second type field effect transistor can include the second transistor of the first embodiment as shown in FIG. 14, the third type field effect transistor can include the first transistor of the second embodiment as shown in FIG. 18, and the fourth type field effect transistor can include the second transistor of the second embodiment as shown in FIG. 18.

Further, while the present invention is described employing CMOS field effect transistors as illustrative example, it is understood that the various transistors illustrated in FIGS. 14 and 18 can be formed as a pair of p-type field effect transistors having different work functions or a pair of n-type field effect transistors having different work functions. Each of the four types of field effect transistors in the third embodiment can be formed for p-type field effect transistors or n-type field effect transistors. Thus, a total of eight types of field effect transistors including four p-type field effect transistors and four n-type field effect transistors can be formed on a same semiconductor substrate to provide a wide range of gate leakage current and work functions for p-type field effect transistors and n-type field effect transistors.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:
1. A method of forming a semiconductor structure comprising a first field effect transistor and a second field effect transistor, said method comprising:
  forming a high dielectric constant material layer comprising a dielectric material having a dielectric constant greater than 8.0 on a semiconductor substrate;
  forming temporary gate structures and a planarization dielectric layer having a planar dielectric surface on said semiconductor substrate, wherein said temporary gate structures include disposable gate material portions;
  recessing said disposable gate material portions below said planar dielectric surface to form gate cavities over said semiconductor substrate;
  simultaneously exposing two different bottom surfaces within said gate cavities, wherein said two different bottom surfaces comprise:
    a first bottom surface of one of said gate cavities that is a surface of a portion of said high dielectric constant material layer; and a second bottom surface of another of said gate cavities that is a surface of a material different from said dielectric material of said high dielectric constant material layer;

forming a contiguous gate dielectric layer on said two different bottom surfaces in said gate cavities and on said planar dielectric surface; and forming first and second gate dielectrics by removing portions of said contiguous gate dielectric layer above said planar dielectric surface, wherein a horizontal portion of said second gate dielectric has a different thickness than a horizontal portion of said first gate dielectric.

2. The method of claim 1, wherein said second gate dielectric includes a U-shaped gate dielectric portion and a planar high dielectric constant material portion having a constant thickness throughout and including a material of a portion of said high dielectric constant material layer, and said first gate dielectric includes another U-shaped gate dielectric portion and does not include any material of said high dielectric constant material layer.

3. The method of claim 2, wherein said U-shaped gate dielectric portion and said other U-shaped gate dielectric portion have the same composition and thickness.

4. The method of claim 3, wherein said planar high dielectric constant material portion has a different composition than said U-shaped gate dielectric portion and said other U-shaped gate dielectric portion.

5. The method of claim 1, wherein said second gate dielectric includes a vertical stack, from bottom to top, of a first interfacial dielectric material portion, said planar high dielectric constant material portion, and said U-shaped gate dielectric portion, and said first gate dielectric includes a vertical stack, from bottom to top, of a second interfacial dielectric material portion and said U-shaped gate dielectric portion without any high dielectric constant material therebetween.

6. The method of claim 1, further comprising:
forming dielectric gate spacers on said temporary gate structures; and
forming source and drain regions in said semiconductor substrate prior to said recessing of said disposable gate material portions.

7. The method of claim 1, further comprising:
forming a barrier metal layer on said a contiguous gate dielectric layer;
foaming a first-type work function metal layer;
patterning said first-type work function metal layer, wherein said barrier metal layer is exposed in one of said gate cavities and is covered by said first-type work function metal layer in another of said gate cavities; and
forming a second-type work function metal layer on said barrier metal layer and on said first-type work function metal layer.

8. The method of claim 7, further comprising:
filling said gate cavities by depositing a gate conductor layer after forming said contiguous gate dielectric layer; and
removing portions of said gate conductor layer, said second-type work function metal layer, said first-type work function metal layer, and said barrier metal layer above said planar dielectric surface employing a planarization process, wherein a first second-type work function metal portion contacting a first-type work function metal portion is formed in one of said first and second field effect transistors, and a second second-type work function metal portion contacting a barrier metal portion comprising the same material as said barrier metal layer is formed in the other of said first and second field effect transistors.

9. The method of claim 7, further comprising:
forming a dielectric masking layer on said first-type work function metal layer; and
removing a portion of said dielectric masking layer from within said one of said gate cavities, wherein a portion of said first-type work function metal layer is removed from within said second gate cavity employing a remaining portion of said dielectric masking layer as an etch mask during said patterning of said first-type work function metal layer.

10. The method of claim 7, wherein said first-type work function metal layer comprises a first metal having a first work function and said second-type work function metal layer comprises a second metal having a second work function, said first metal and said second metal are selected such that one of said first and second work functions is closer to a conduction band of said semiconductor material than a valence band of said semiconductor material, and the other of said first and second work functions is closer to said valence band than to said conduction band.

11. The method of claim 1, wherein said contiguous gate dielectric layer is a second high dielectric constant material layer having a dielectric constant greater than 8.0.

12. The method of claim 1, wherein said contiguous gate dielectric layer consists of a second high dielectric constant material layer having a dielectric constant greater than 8.0.

13. The method of claim 1, wherein said contiguous gate dielectric layer is deposited directly on said first bottom surface and said second bottom surface.

14. The method of claim 13, wherein said contiguous gate dielectric layer is deposited directly on said planar dielectric surface.

15. The method of claim 13, wherein said contiguous gate dielectric layer is a second high dielectric constant material layer having a dielectric constant greater than 8.0.

16. The method of claim 13, wherein said contiguous gate dielectric layer consists of a second high dielectric constant material layer having a dielectric constant greater than 8.0.

17. The method of claim 1, wherein said second bottom surface is a surface of an interfacial dielectric material portion comprising a dielectric oxide, a dielectric nitride, or a dielectric oxynitride of a semiconductor material of said semiconductor substrate.

18. The method of claim 1, wherein said second bottom surface is a semiconductor surface of a semiconductor material of said semiconductor substrate.

19. The method of claim 1, wherein said contiguous gate dielectric layer is simultaneously formed on said two different bottom surfaces in said gate cavities and on said planar dielectric surface.

* * * * *